US006784824B1

(12) United States Patent
Quinn

(10) Patent No.: US 6,784,824 B1
(45) Date of Patent: Aug. 31, 2004

(54) ANALOG-TO-DIGITAL CONVERTER WHICH IS SUBSTANTIALLY INDEPENDENT OF CAPACITOR MISMATCH

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 10/231,541

(22) Filed: Aug. 29, 2002

(51) Int. Cl.[7] .................................................. H03M 1/12

(52) U.S. Cl. ......................... 341/172; 341/120; 341/155

(58) Field of Search ................................ 341/118, 120, 341/155, 172

(56) References Cited

U.S. PATENT DOCUMENTS

| | | | | |
|---|---|---|---|---|
| 5,574,457 A | * 11/1996 | Garrity et al. | .............. | 341/172 |
| 6,097,326 A | * 8/2000 | Opris et al. | ................. | 341/161 |
| 6,249,240 B1 | * 6/2001 | Bellaouar | ................... | 341/172 |
| 6,366,230 B1 | * 4/2002 | Zhang et al. | ............... | 341/162 |
| 6,433,712 B1 | * 8/2002 | Ohnhaeuser et al. | ......... | 341/118 |
| 6,441,765 B1 | * 8/2002 | Aram | .......................... | 341/155 |
| 6,486,807 B2 | * 11/2002 | Jonsson | ....................... | 341/120 |
| 6,486,820 B1 | * 11/2002 | Allworth et al. | ............ | 341/161 |
| 6,577,185 B1 | * 6/2003 | Chandler et al. | .............. | 330/9 |
| 6,600,440 B1 | * 7/2003 | Sakurai | ....................... | 341/172 |
| 6,606,042 B2 | * 8/2003 | Sonkusale et al. | .......... | 341/120 |

* cited by examiner

*Primary Examiner*—Michael Tokar
*Assistant Examiner*—Linh V Nguyen
(74) *Attorney, Agent, or Firm*—Steve Funk; LeRoy D. Maunu

(57) ABSTRACT

A method, apparatus, and system for providing accurate level shifting, residue multiplication, and sample-and-hold functions for ADCs, while eliminating capacitor mismatch as a source of ADC errors. An input signal is sampled onto a first capacitor, and the complemented input signal is sampled onto a second capacitor. The sampled input signal is provided to a first input terminal of a unity gain amplifier by controllably connecting the first capacitor between the amplifier output and the first input terminal. An inverted version of the sampled complemented input signal is level shifted and provided to the amplifier's second input terminal by controllably coupling the second capacitor between a selected level-shift voltage and the second input terminal. The sampled analog input signal is added to the inverted version of the sampled complemented analog input signal, while subtracting the selected level-shift voltage, to provide a residue signal available for use in subsequent conversion stages.

34 Claims, 14 Drawing Sheets

ANALOG-TO-DIGITAL CONVERTER WHICH IS SUBSTANTIALLY INDEPENDENT OF CAPACITOR MISMATCH

FIELD OF THE INVENTION

The present invention generally relates to analog-to-digital converters (ADCs), and more particularly to a system, method, and apparatus for providing accurate ADC stage functionality while avoiding capacitor mismatch and non-linearity problems.

BACKGROUND

The ubiquitous switched capacitor charge transfer circuit has long been used in a wide range of signal processing applications. Switched capacitor circuits are a class of discrete-time systems that are often used in connection with filters, analog-to-digital converters (ADCs), digital-to-analog converters (DACs), and other analog/mixed signal applications. Conventional switched capacitor circuits are based on creating coefficients of a transfer function by transferring charge from one input capacitor $C_1$ to a second capacitor $C_2$ in the feedback loop of an amplifier via the virtual node of that amplifier so as to create a transfer of $C_1/C_2$. For example, a gain of two can be created by making $C_1=2*C_2$.

However, finite amplifier DC gain and bandwidth cause incomplete charge redistribution, resulting in incomplete charge transfer from $C_1$ to $C_2$. This, together with inaccuracies in the matching of the capacitors $C_1$ and $C_2$, results in the creation of an inaccurate transfer function. Many applications, such as ADCs, require very high accuracies in the transfer function, such as accuracies exceeding 0.1%. This kind of accuracy is virtually impossible using conventional circuits in modern day CMOS processes. Often, the values of the capacitors are trimmed at manufacture, or some active calibration routines are executed, switching in and out small value capacitors in order to create an accurate transfer. Such schemes are expensive for high volume manufacture. To reduce capacitor mismatch problems, special capacitors such as double poly or Metal-Insulator-Metal (MiM) capacitors may be used, but the capacitor mismatch problem is not eliminated. Further, such circuits that employ voltage-to-charge and charge-to-voltage translations via the virtual earth node have limited immunity to extraneous noise sources, as the virtual earth node is a well known pick-up point for unwanted noise.

Prior art switched capacitor circuits such as those described above are often used in the design of ADCs, such as pipelined and algorithmic ADCs. The transfer characteristic of such ADCs is affected by non-linearities in the analog hardware. While offsets in the amplifier and comparators may be corrected through the use of digital error correction (DEC) logic, other sources of error remain. These include the inaccuracies in the creation of a multiply-by-two (MX2) gain function (including subtraction of sub-DAC levels), and variations in the reference levels. Variations in the reference levels is only an issue in pipelined ADCs, in which separate hardware in each stage samples +Vref and −Vref. Static errors in the reference levels are not an issue for algorithmic ADCs, since each rotation of the ADC samples the same references in the same way with the same hardware. The absolute accuracy of the reference levels is not important in a differential implementation, as long as they are stable and do not vary from conversion to conversion. Thus, the remaining sources of error that limit the accuracy of the complete ADC are the accuracy of the MX2 function, and the accuracy of the sub-DAC through the accuracy with which the DAC levels can be generated. In actual state of the art implementations, these errors are predominantly caused by the capacitor mismatch problems described above.

The present invention addresses these and other shortcomings of the prior art, and provides a solution to the problems exhibited by prior art switched capacitor ADC circuits.

SUMMARY OF THE INVENTION

In various embodiments, the present invention provides a method, apparatus, and system for providing accurate level shifting, residue multiplication, and sample-and-hold functions for analog-to-digital conversions, without requiring charge transfer between capacitors in a switched capacitor arrangement, thereby eliminating capacitor mismatch as a source of ADC errors.

In accordance with one embodiment of the invention, an ADC stage is provided for use in analog-to-digital conversions. The ADC stage includes an amplifier having first and second input terminals, and an output terminal to provide an analog ADC residue signal. First and second capacitances sample an input voltage signal and a complemented input voltage signal respectively, in response to a first clock phase. A first switch circuit is coupled to the first capacitance to provide the sampled input voltage signal to the first input terminal of the amplifier, and to couple the output terminal of the amplifier to the first capacitance via a feedback loop, in response to a second clock phase. A second switch circuit is coupled to the second capacitance to provide an inverted version of the sampled complemented input voltage signal to the second input terminal of the amplifier in response to the second clock phase. A level shifting circuit is coupled to receive the input voltage signal, and in response, to select one of a plurality of reference voltages. The amplifier adds the input signal to the inverted version of the complemented input signal as shifted by the level shifting circuit, to create the analog ADC residue signal for use in a subsequent ADC stage. Differential and/or double-sampling versions are also provided in accordance with the present invention. Further, the present invention may be used in a number of ADC configurations, including algorithmic and pipelined ADC configurations.

In accordance with another embodiment of the invention, a method is provided for converting an analog input signal to a digital signal using an amplifier. The method includes sampling the analog input signal onto a first capacitor, and the complement of the analog input signal onto a second capacitor. The sampled analog input signal is provided to a first input terminal of the amplifier by controllably connecting the first capacitor between the amplifier output and the first input terminal in a unity gain feedback configuration. An inverted version of the sampled complemented analog input signal, level shifted by one of a plurality of selectable reference voltages, is provided at a second input terminal of the amplifier by controllably coupling the second capacitor between a selected reference voltage and the second input terminal of the amplifier. The sampled analog input signal is added to the inverted version of the sampled complemented analog input signal, and the selected reference voltage is subtracted therefrom to provide a residue signal available for use in subsequent conversion stages.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
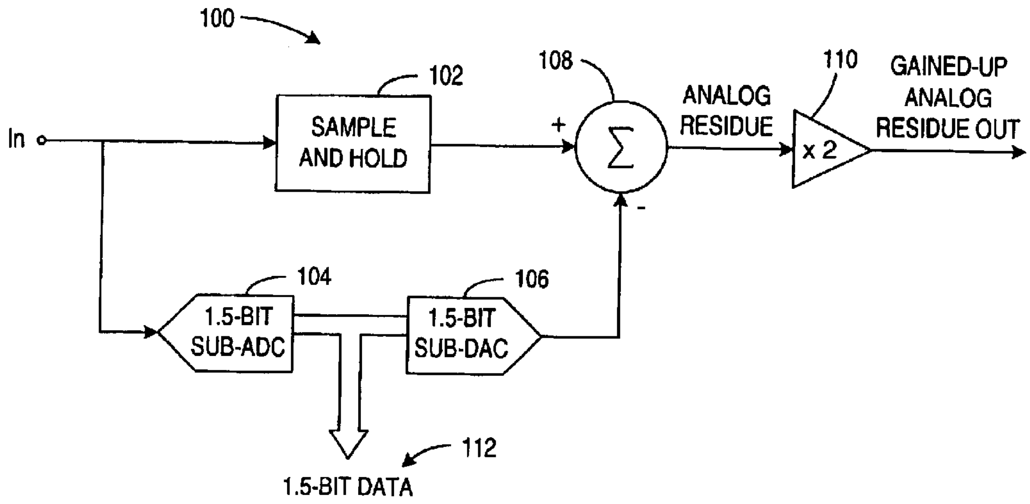
FIG. 1 is a block diagram illustrating a typical 1.5-bit ADC stage.

In the following description of the exemplary embodiment, reference is made to the accompanying drawings which form a part hereof, and in which is shown by way of illustration various manners in which the invention may be practiced. It is to be understood that other embodiments may be utilized, as structural and operational changes may be made without departing from the scope of the present invention.

The present invention is directed to an analog-to-digital converter (ADC) for use in various ADC architectures, such as algorithmic and pipelined ADC architectures. The ADC circuit in accordance with the present invention provides a very accurate manner of subtracting/level shifting, residue multiplication, and sample-and-hold (S&H) functions, all within a single clock cycle. In accordance with the invention, these functions are performed using a switched capacitor technique that is first order independent of capacitor matching. This enables its use in new digital technology processes, such as Complementary Metal-Oxide Semiconductor (CMOS) processes, that are uncharacterized for capacitor matching and analog performance.

In prior art ADC circuits such as 1.5-bit ADC stages, charge transfer occurs from one input capacitor to a second capacitor in the feedback look of an amplifier via the virtual earth node of the amplifier. In this manner, the input capacitor discharges to the feedback capacitor, giving rise to an output voltage that is proportional to the capacitor ratio (i.e., input capacitance/feedback capacitance). For example, a gain of "2" may be created by providing an input capacitor having a capacitance value twice that of the feedback capacitor.

The present invention, on the other hand, adds capacitor voltages only, with the amplifier serving as a buffer. For example, in one particular embodiment of the invention utilizing 1.5-bit ADC stages, a signal voltage may be sampled onto two capacitors on one clock cycle. On a following clock cycle one of the capacitors is placed in the feedback loop of the amplifier, and the other capacitor is inverted and connected between the amplifier's negative input terminal and any one of a predetermined number of voltages used in the 1.5-bit stage (e.g., +Vref, 0, −Vref), giving rise to an effective doubling of the input sample voltage combined with subtraction of one of the predetermined voltages. The resulting voltage is held at an output on a subsequent clock cycle so that it can be, for example, sampled by a subsequent stage of a pipeline ADC, or sampled in once again by a subsequent set of capacitors in an algorithmic ADC. By summing only capacitor voltages and using the amplifier as a buffer, multiplication by two, for example, does not depend on the absolute values of the capacitors, giving rise to a very robust solution suitable for embedding in digital environments. Chip area and power consumption are consequently reduced, thereby providing enhanced power and area figures-of-merit (FOMs) compared to current ADC designs.

A number of ADC architectures currently exist, and design choices are often made based on parameters including speed, power consumption, required real estate, complexity, etc. For example, a straightforward and fast ADC architecture is the flash architecture, where a number of parallel comparator circuits compare sampled/held analog signals with different reference levels. However, because each reference level should be no further than one least significant bit (LSB) apart, a large number of comparators may be required for such an architecture. For example, an N-bit ADC requires $2^n$ comparators. Where the full scale input is a relatively small voltage, the LSB size will be relatively small, and the offset of the comparator needs to be very small which may be difficult to achieve with technologies such as CMOS, and special circuit techniques may be required. Flash ADCs are therefore generally limited to smaller resolution converters, such as 8-bit or less resolution.

Two-step flash architectures arose to address some of the problems of flash ADCs, where the two-step flash ADCs first performs a course quantization, the held signal is the subtracted from an analog version of the course quantization, and the residue is then more finely quantized. This significantly reduces the number of comparators required in a standard flash ADC architecture, but additional clock cycles are required to process the signal due to the extra stage. Another enhancement arose, where interstage gain was used to tolerate larger comparator offset for second stage comparators, which ultimately led to the pipelined ADC architecture employing multiple stages. The sampled input at each stage of a pipelined ADC architecture is converted to a particular resolution of the stage, such as n bits.

An ADC architecture resolving 1 bit per stage with one-half bit overlap is referred to as a "1.5-bit" ADC architecture. In order to facilitate an understanding of the invention, various embodiments of the description provided herein are described in terms of such a 1.5-bit architecture. Examples of such architectures are set forth below to provide an appropriate, representative context in which the principles of the present invention may be described. However, it will be apparent to those skilled in the art from the description provided herein that the present invention is scalable and equally applicable to other analogous ADC architectures.

FIG. 1 is a block diagram illustrating a typical 1.5-bit ADC stage 100. The circuit 100 includes a sample-and-hold (S&H) circuit 102, a 1.5-bit sub-ADC 104, a 1.5-bit sub-DAC 106, a subtractor 108, and a multiplier 110. Such an architecture is used in pipelined or algorithmic ACS to provide maximum bandwidth and low sensitivity to component mismatches. This is because each stage 100 requires only two comparators (not shown) having an accuracy of +/−(Vref/4) for the 1.5-bit sub-ADC 104, and one multiplier (e.g., amplifier) 110. The associated comparator and amplifier offset can easily be corrected using standard digital error correction (DEC) techniques.

In the circuit of FIG. 1, the input voltage "In" is sampled by the sample-and-hold 102 and resolved into a 1.5-bit digital code in a course analog-to-digital sub-converter (sub-ADC) 104. With a 1.5-bit sub-ADC, only three codes are possible, such as 00, 01, 10. The resulting 1.5-bit code 112 is outputted to a digital error correction circuit. The code is also converted, via a digital-to-analog sub-converter (sub-DAC) 106, back into a course analog signal with one of three predetermined analog values, such as −Vref/2,0, +Vref/2. The result is subtracted from the sampled-and-held analog input signal "In" via subtractor 108. The resulting analog "residue" is gained up by a factor of two using the multiplier 110 to become the input voltage for the successive conversion.

As can be seen, the analog equivalent of the sub-ADC 104 output plus the output residue (prior to multiplication) is equal to the analog input voltage. Thus, any perturbation in the residue due to non-idealities can introduce differential nonlinearity (DNL) errors. Effectively, all errors in the gained up analog residue after the first conversion should be less than 1 LSB of the remaining resolution of the ADC (or less than 2 LSBs of the total resolution at N-bit level).

Figure 2:
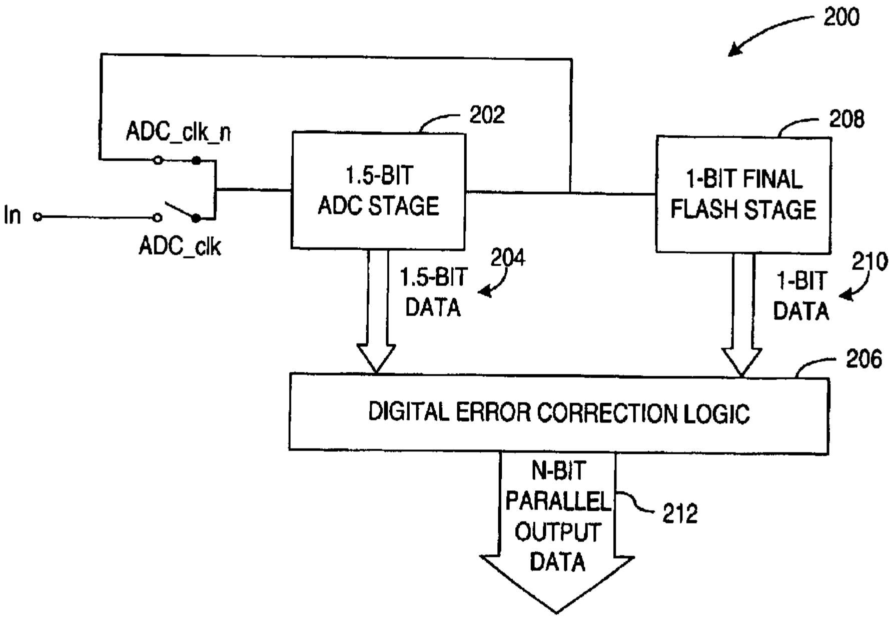
FIG. 2 is a block diagram of an N-bit algorithmic ADC.

An N-bit algorithmic ADC 200 shown in FIG. 2 is formed by sampling the input signal on the first clock cycle, and sampling the output of the 1.5-bit stage 202 on the next N−1 cycles. The 1.5-bit data 204 from each rotation are added up with 1-bit overlap in the DEC 206 circuit such that the least significant bit (LSB) from one rotation is added to the most significant bit (MSB) from the next rotation. Each rotation of the ADC resolves one effective bit from the MSB level down to the LSB−1 level. The final LSB bit is often resolved using a simple 1-bit flash 208, e.g., a comparator with its threshold set to 0V. This bit 210 is not added, but rather is concatenated to the parallel data 212 of the DEC 206.

Figure 3:
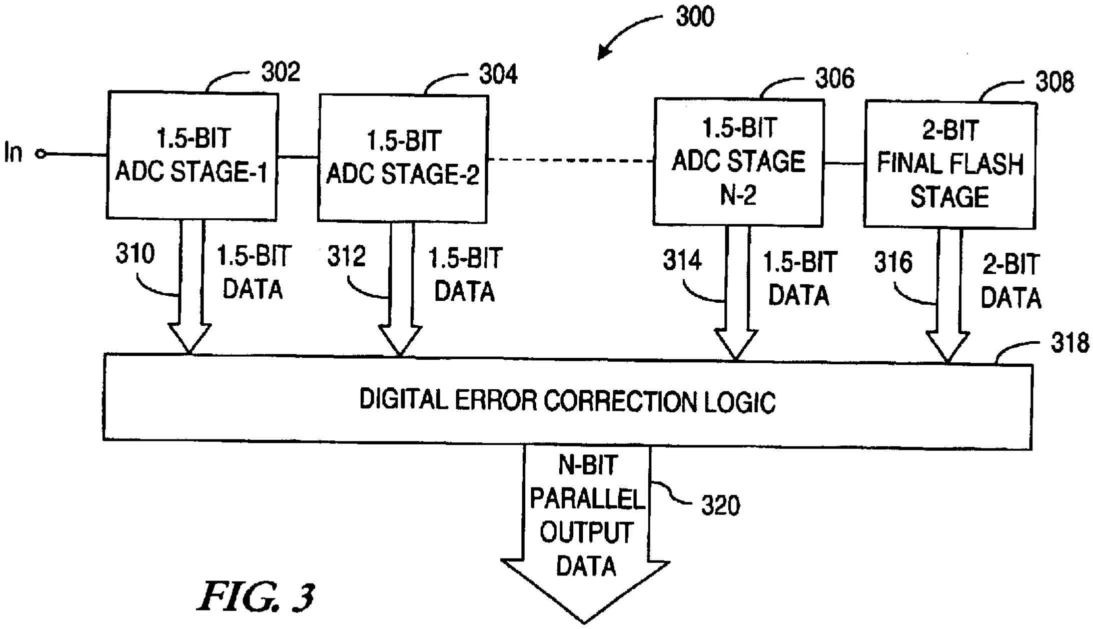
FIG. 3 is a block diagram of a representative pipelined ADC.

Alternatively, a series of such stages may be used to create a pipelined ADC, such as the representative pipelined ADC 300 shown in FIG. 3. The pipelined ADC 300 includes a series of N−2 stages 300, 302, . . . 304, such as those described in connection with FIG. 1, as well as an Nth stage 306. Stages 300, 302, . . . 304 may be used to resolve N−2bits, with the final stage 308 being a 2-bit flash to absolutely resolve the final two bits. The 1.5-bit data 310, 312, . . . 314 and 2-bit data 316 is provided to the DEC 318 to create the N-bit parallel output data 320. The sample rate of the pipeline is approximately N times faster than that of the algorithmic architecture, depending ultimately on what resolution flash converter is used for the final stage 308.

Figure 4:
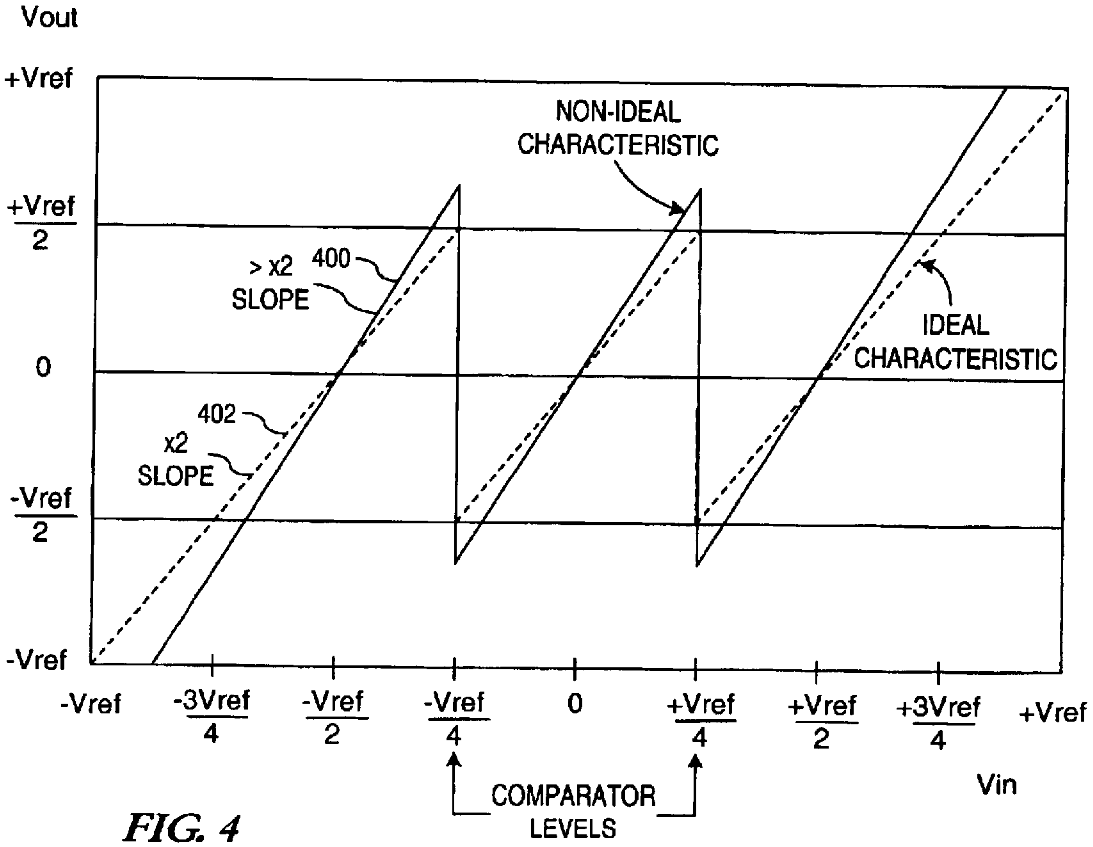
FIG. 4 illustrates an example of a residue transfer characteristic of a complete 1.5-bit ADC stage.

An example of a residue transfer characteristic of the complete 1.5-bit ADC stage is shown in FIG. 4. In this example, it is assumed that the full signal range is between −Vref and +Vref. The transfer function is defined by Equation 1 below:

$$V_{out}=2\times V_{in}+D\times V_{ref} \qquad \text{EQUATION 1}$$

where D can take on any one of the values {−1, 0, +1} depending on whether the analog input voltage falls within corresponding ranges of $$\left\{\left(+V_{ref}\rightarrow+\frac{V_{ref}}{4}\right),\left(+\frac{V_{ref}}{4}\rightarrow-\frac{V_{ref}}{4}\right),\left(-\frac{V_{ref}}{4}\rightarrow-V_{ref}\right)\right\}.$$

Vout of Equation 1 may either be resampled into the algorithmic ADC on a subsequent rotation, or may become the input voltage for a subsequent stage of a pipelined ADC.

In an actual implementation, the transfer characteristic is affected by non-idealities in the analog hardware. As previously indicated, offsets in the amplifier and comparators can be corrected by the DEC. The two remaining sources of error in an actual implementation include inaccuracies in the creation of the multiply-by-two (MX2) gain function (including subtraction of sub-DAC levels), and variations in the reference levels. Variations in reference levels are-issues only in pipelined ADCs, in which separate hardware in each 1.5-bit stage samples +Vref and −Vref, where uncorrelated errors can occur from stage to stage. Static errors in the reference levels are not an issue for algorithmic ADCs, since each rotation of the ADC samples the same references in the same way with the same hardware. The absolute accuracy of the reference levels is not important in a differential implementation, as long as the reference levels are stable, within the usable dynamic range of the active circuitry, and do not vary from conversion to conversion. At most, the gain transfer is affected without affecting DNL/INL. Thus, the only two remaining sources of error that limit accuracy of the complete ADC are the accuracy of the multiply (MX2) function and the DAC levels (sub-DAC). In conventional implementations, this error is predominantly caused by capacitor mismatch.

The combined accuracy of the MX2 and sub-DAC functions must be better than one LSB of the remaining resolution of the ADC in order to guarantee no missing codes. The first stage of the pipeline has the most stringent requirement here, as the MX2/sub-DAC functions for an N-bit ADC must be accurate to at least N−1 bits, which is the number of bits yet to be resolved after the first stage. The required resolution of an N-bit algorithmic ADC is commensurate with the required resolution of the first stage of a pipeline, i.e., N−1 bits. For a robust design—and to account for other sources of error, most notably noise—the accuracy of the MX2 amplifier with sub-DAC, after including all possible contributions of error, should be designed to be at least 0.5 LSBs of the remaining resolution, i.e., N bits accuracy.

The effect of a gain error in the first stage of a pipeline, or the first rotation of an algorithmic, is illustrated in FIG. 4. The comparator levels of the two comparators of the 1.5-bit stage are set to −Vref/4 and +Vref/4 respectively. It can be seen that when the gain of the stage is too high, over-ranging can occur where the slope 400 of the MX2 is greater than the ideal slope 402 of the MX2. This causes the input signal to the next stage to go beyond the maximum allowable range {+Vref and −Vref} for conversion.

Figure 5A:
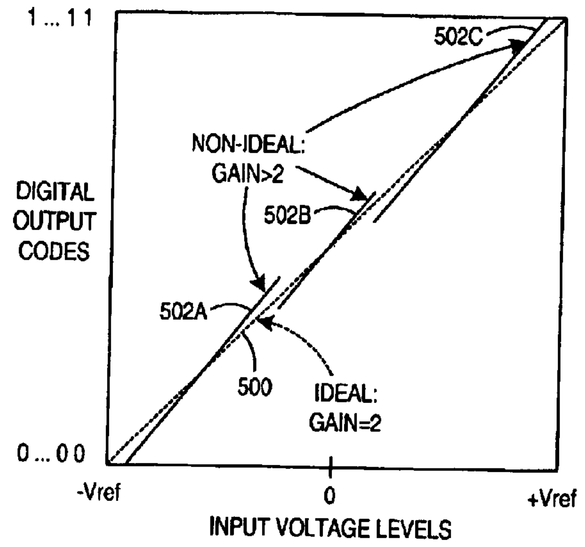
FIG. 5A is a graph illustrating the effects on the transfer function of an ADC exhibiting a gain error greater than two in the multiply-by-two function.
Figure 5B:
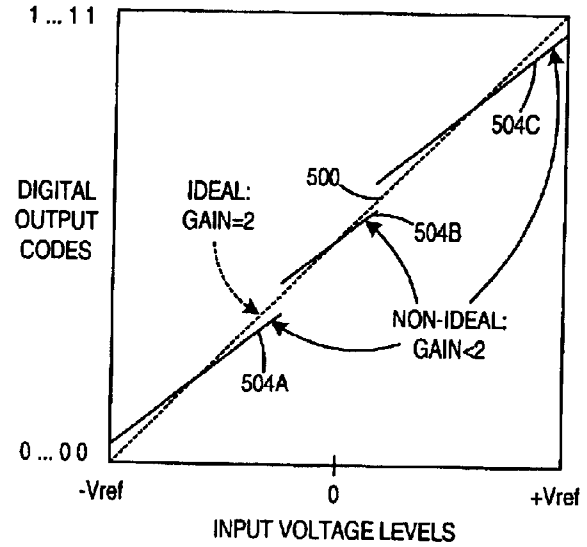
FIG. 5B is a graph illustrating the effects on the transfer function of an ADC exhibiting a gain error less than two in the multiply-by-two function.
Figure 5C:
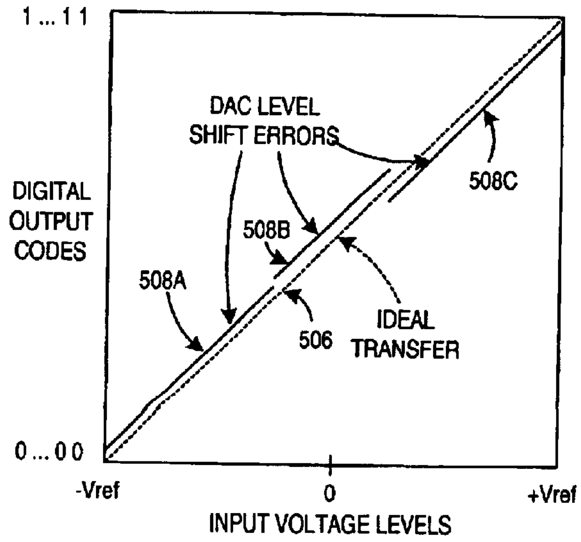
FIG. 5C is a graph illustrating the effect of sub-DAC errors in the first stage of the ADC on the total transfer function.

The effects on the complete transfer function of the ADC are shown in FIGS. 5A, 5B, and 5C for gain errors and sub-DAC errors in the first stage of a pipeline or in the algorithmic ADC. FIG. 5A shows the effect of a gain error greater than two in the MX2 which produces non-monotonicity and the potential for missing codes. Where the ideal gain is equal to two as shown on dashed line 500, non-ideal gain error greater than two as shown on lines 502A, 502B, 502C can result in missing digital output codes. Similarly, FIG. 5B shows the effect of a gain error less than two in the MX2 which produces missing codes. Where the ideal gain is again equal to two as shown on dashed line 500 of FIG. 5B, non-ideal gain error less than two as shown on lines 504A, 504B, 504C can result in missing digital output codes. Further, FIG. 5C shows the effect of sub-DAC errors in the first stage of the ADC on the total transfer function. The ideal transfer function is shown on dashed line 506, and various representative DAC level shift errors are shown on lines 508A, 508B, and 508C, which will result in missing codes. These errors are caused by capacitor mismatch and non-linearity. In practice, all these errors will propagate from the MSB to the LSB level, eventually (and undesirably) producing a jagged transfer function for the complete ADC.

Figure 6A:
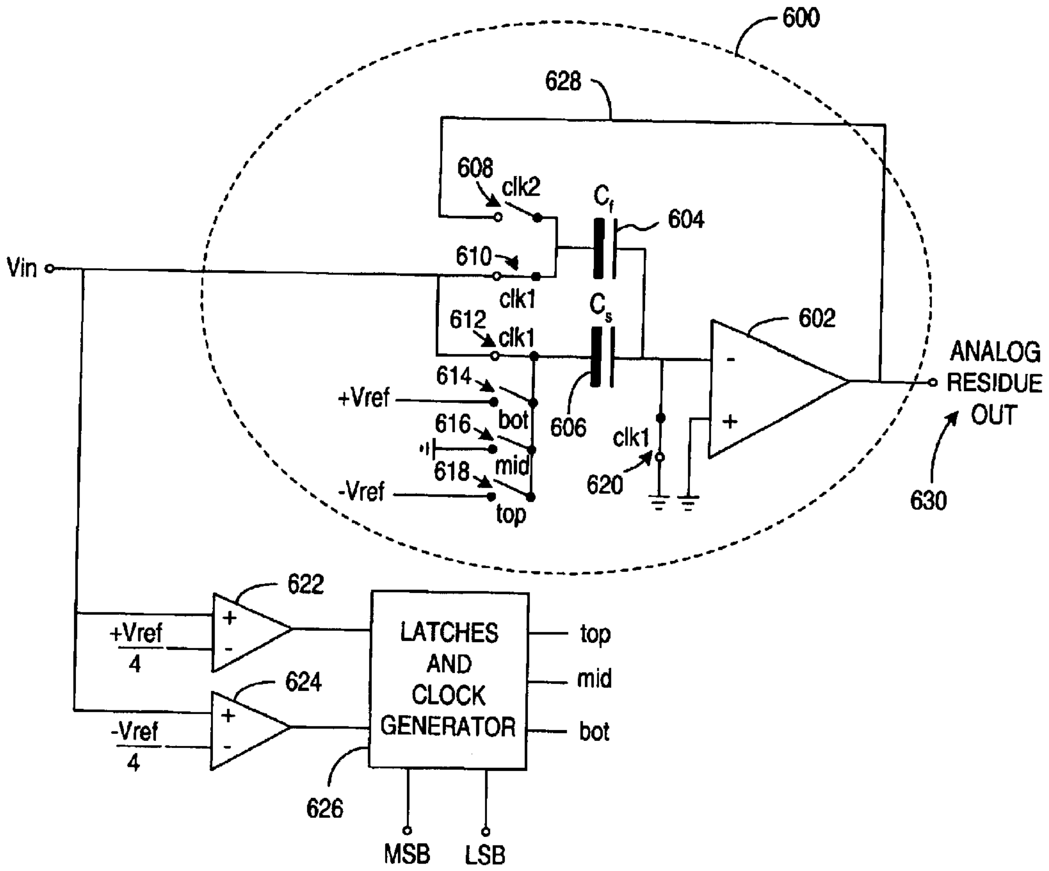
FIG. 6A illustrates a switched capacitor implementation of a 1.5-bit stage for a single-ended application.

Current 1.5-bit designs exhibit characteristics that are responsible for much of this gain error. A switched capacitor implementation of a 1.5-bit stage for a single-ended application is shown in FIG. 6A, a portion of which includes a prior art switched capacitor (SC) circuit 600. The switched capacitor circuit 600 includes an amplifier 602, two nominally equal capacitors $C_f$ 604 and $C_s$ 606, and several switches 608, 610, 612, 614, 616, 618, 620. Two opposite phased clock signals, clk1 and clk2, are non-overlapping. The switched capacitor circuit 600 performs the level shifting, residue multiplication by two (MX2), and sample-and-hold buffering as is known in the art. The input signal Vin is applied to the sub-ADC including comparators 622, 624, with voltage thresholds set at +Vref/4 and −Vref/4 respectively. Concurrently, the input signal Vin is sampled onto $C_s$ 606 and $C_f$ 604. At the end of the first clock phase, ckl1, Vin is completely sampled onto $C_s$ 606 and $C_f$ 604, while the output of the sub-ADC 622, 624 is latched and held by latches associated with the latches and clock generator 626. During clk2, $C_f$ 604 is switched via switch 608 and placed across the amplifier 602, completing its negative feedback loop 628. At the same time, one of the input switches 614, 616, 618 connected to $C_s$ 606 is closed by the sub-DAC using only one of the clock signals top, mid, bot. In this manner, the analog residue voltage is produced at the output 630, such that Vout is provided as shown in Equation 2:

$$V_{out} = \left(1 + \frac{C_s}{C_f}\right) \times V_{in} + D \times V_{ref} \quad \text{Equation 2}$$

where:

| $V_{in}$ | D | Bot | Mid | Top |
|---|---|---|---|---|
| $V_{in} > V_{ref}/4$ | $-C_S/C_f$ | 1 | 0 | 0 |
| $-V_{ref}/4 \leqq V_{in} \leqq +V_{ref}/4$ | 0 | 0 | 1 | 0 |
| $V_{in} < -V_{ref}/4$ | $+C_S/C_f$ | 0 | 0 | 1 |

By choosing capacitors $C_s$ 606 and $C_f$ 604 to have the same value, Equation 2 is made to correspond to the ideal transfer function of Equation 1 of a 1.5-bit stage. The reference levels can be generated accurately and is generally not a limitation on the realization of a high resolution ADC (e.g., 12-bit level). The single factor that ultimately determines the maximum resolution of the ADC is the capacitor mismatch. This mismatch has two effects on the performance of current state-of-the-art designs, including 1) it affects the accuracy of the MX2 function, and 2) it affects the accuracy of the sub-DAC through the accuracy with which the DAC levels {−Vref, 0, +Vref} can be generated.

In order to achieve 10-bit performance, a matching of the order of 0.1% is needed between $C_s$ 606 and $C_f$ 604. This is currently not possible to achieve in standard CMOS processes without using special capacitor options, such as the use of poly-poly capacitors. Even using such specialized capacitors, very large values for the capacitors are needed (i.e., on the order of many picofarads), to guarantee 0.1% matching across all process corners. Such large value capacitors would be responsible for creating an ADC that requires a great deal of real estate and exhibits significant power consumption. For a pipelined ADC with N−1 stages, such an approach is unacceptable. Alternatively, calibration routines are sometimes used to either trim the values of the capacitors or to digitally calibrate out the gain error in a post-processing routine. Such correction/calibration routines are needed to achieve a resolution better than ten bits due to the limitations of the processing technology on prior art ADC circuit architectures. Complicated calibration routines exist which add area, power consumption, and latency to the conversion. Typically, many (e.g., up to seven) clock cycles per bit are needed to calibrate away capacitor mismatch errors. Still a further point of issue can be capacitor linearity: any non-linearity in $C_s$ 606 and $C_f$ 604 of FIG. 6A will cause non-linearity in the MX2 amplifier 602 and cause differential nonlinearity (DNL) and integral non-linearity (INL) errors.

Figure 6B:
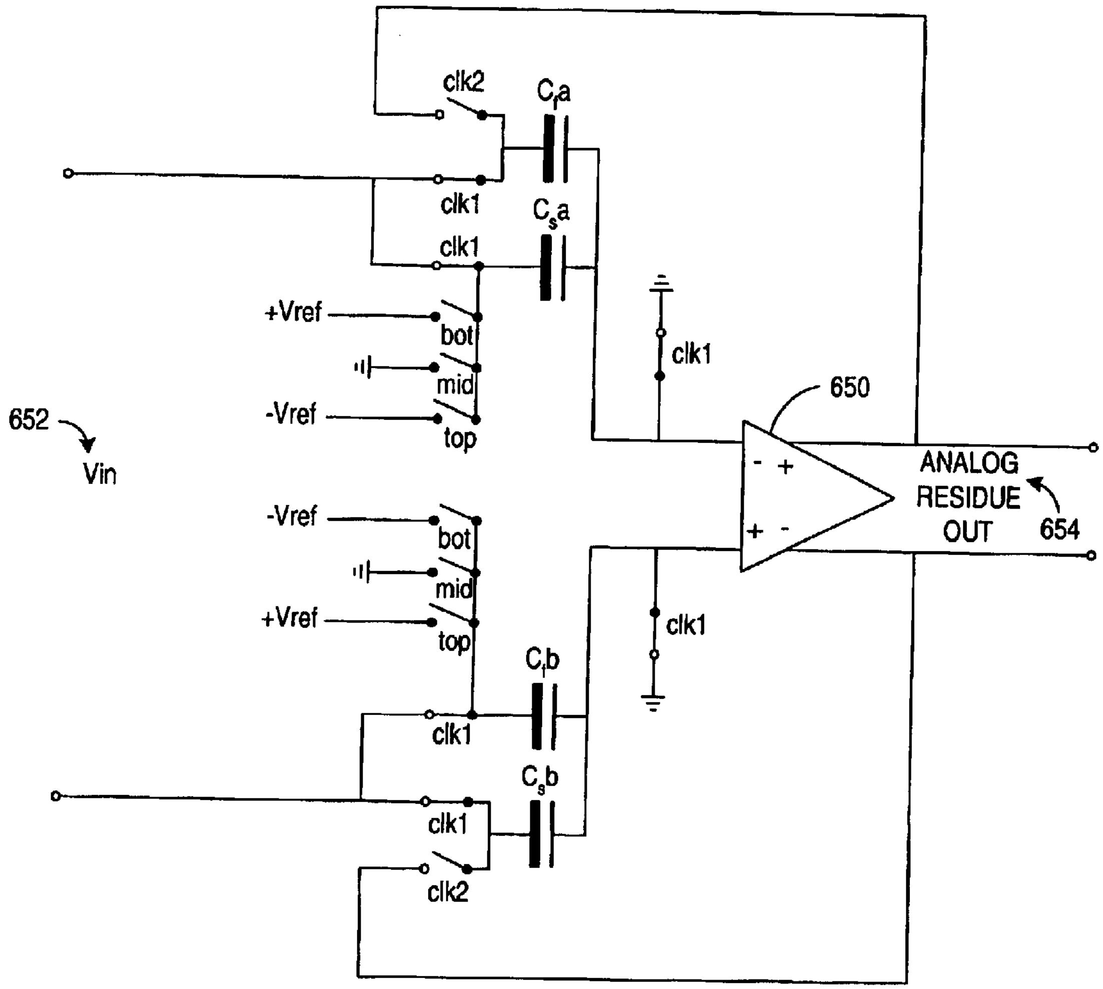
FIG. 6B illustrates a differential switched capacitor implementation of a 1.5-bit stage.

For well known reasons of noise immunity and increased dynamic range, conventional ADC solutions may be realized using a fully differential amplifier. FIG. 6B illustrates a differential switched capacitor implementation of a 1.5-bit ADC stage. The conventional switched capacitor implementation includes a differential amplifier 650, as well as a differential input signal Vin 652 and a differential output signal 654. In such a conventional differential amplifier implementation, the differential amplifier 650 is used, charge is transferred between capacitors, and a capacitor ratio is still used to establish the gain (multiplication by 2, for example). As previously stated in the single-ended example, all of the charge on one capacitor is transferred to the other capacitor, and any error in the charge transfer results in errors in the total transfer function. The capacitance mismatch and non-linearity problems may be exacerbated where double-sampling techniques are used. A double-sampling ADC stage may be realized that samples the inputs on a first clock phase ckl1 and delivers its output on a second clock phase clk2, and can also sample the inputs on clk2 and deliver its output on ckl1 through the use of an additional set of capacitors. By doubling the capacitors in this way, it is possible to double the conversion rate of the ADC for the same analog power dissipation. However, in current state-of-the-art designs, double-sampling introduces unwanted characteristics around half the sampling frequency due to the extra mismatch that occurs between both of the double-sampling channels from mutual capacitor mismatch on ckl1 and clk2. To reduce such a mismatch, the capacitors would need to be even larger than in the single-sampling version, meaning more power and area consumption which is undesirable. Mainly for these reasons, double-sampling is often not used in current ADC implementations.

The present invention addresses a number of shortcomings of prior art ADC technologies, including the aforementioned error situations exhibited by current ADC technologies. The present invention significantly reduces errors in the MX2 (or other multiplier) function, as well as errors in the generation of DAC levels, that are present in conventional ADC technologies. The present invention is first order independent of capacitor matching, enabling accurate, relatively high bit-width $ADC_s$ in CMOS (and other technologies) that are otherwise uncharacterized for matching of analog components. Further, the apparatus and methodology in accordance with the present invention allows for use of simple metal layer capacitors as the signal capacitors, while still achieving accurate, high bit-width performance. The present invention is also substantially faster than prior art $ADC_s$ employing analogous hardware. Thus, with use of similar amplifiers and capacitors in both prior art systems and in the present invention, the present invention is substantially faster than the prior art systems by virtue of the fact that the feedback factor (and, consequently the gainbandwidth) for the amplifiers is substantially larger.

Figure 7A:
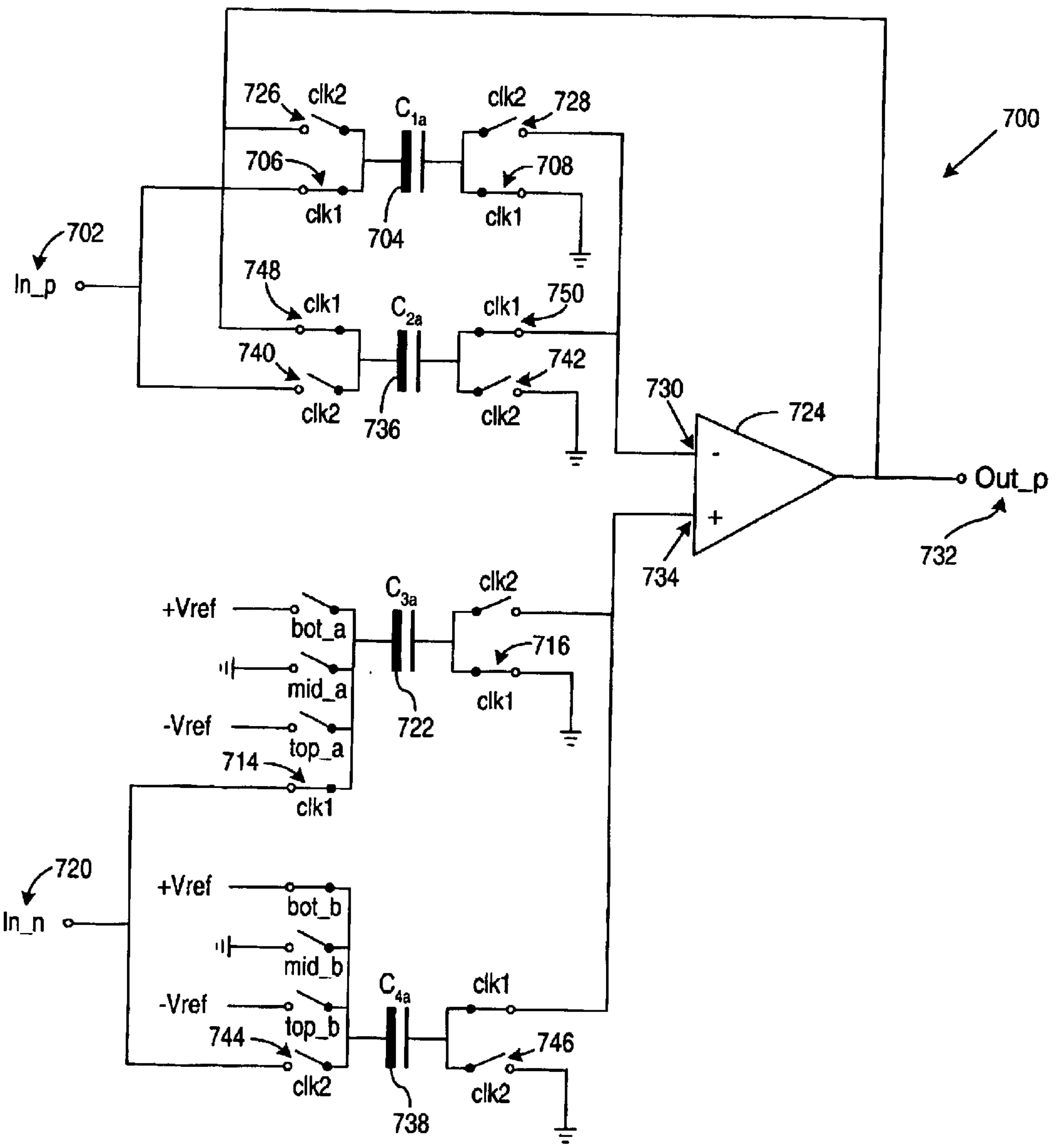
FIGS. 7A and 7B illustrate two halves of a representative differential 1.5-bit ADC stage in accordance with the principles of the present invention.
Figure 7B:
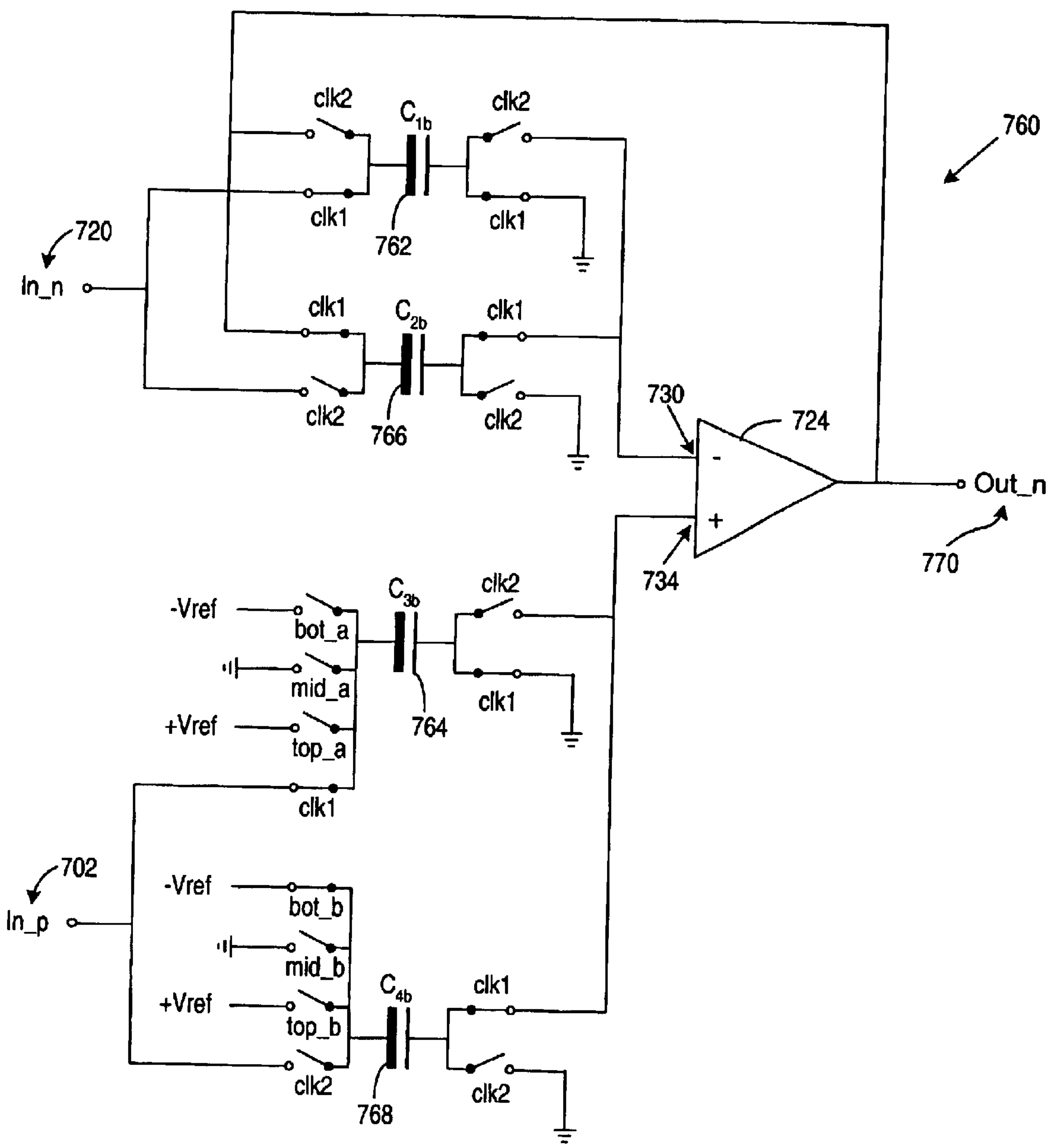

Referring to FIG. 7A, a block diagram of a representative 1.5-bit ADC stage 700 corresponding to a first half of a differential implementation is illustrated. FIG. 7B illustrates a second half of the representative differential implementation. Two opposite phased clock signals are used, namely clock phases ckl1 and clk2. First considering the top half of the differential implementation shown in FIG. 7A, In_p 702 of the differential input signal is sampled onto capacitance $C_{1a}$ 704 with respect to ground on clock phase ckl1 by closing switches 706 and 708. During clock phase ckl1 of the illustrated embodiment, a number of other different switches are closed, including switches 714 and 716. Thus, In_n 720 of the differential input signal is also sampled onto capacitance $C_{3a}$ 722 due to switches 714 and 716 being closed during clock phase ckl1. In one embodiment of the invention, bottom plate sampling is used, where the input signals In_p 702 and In_n 720 are sampled on to the bottom plate of the capacitances $C_{1a}$ 704 and $C_{3a}$ 722 respectively. The top plates of capacitances $C_{1a}$ 704 and $C_{3a}$ 722 are coupled to ground during the ckl1 phase.

On the next clock phase, clk2, $C_{1a}$ 704 is connected across the amplifier 724 due to switches 726 and 728 closing, and switches 706 and 708 opening. Thus, the top plate of capacitance $C_{1a}$ 704 is coupled to the negative input 730 of the amplifier 724, and the bottom plate of capacitance $C_{1a}$ 704 is coupled to the output (Out_p 732) of the amplifier 724. Assertion of clock phase clk2 also causes capacitance $C_{3a}$ 722 to have its bottom plate connected to any one of the voltages +Vref, 0, −Vref. Such voltages are controllably selected by sub-DAC control signals labeled as the top (top_a), middle (mid_a), or bottom (bot_a). The top plate of capacitance $C_{3a}$ 722 is then coupled to the positive input terminal 734 of the amplifier 724 on clk2. In this manner, one of the output control signals of the sub-DAC (i.e., bot_a, mid_a, top_a) selects a corresponding +Vref, 0, or −Vref voltage, which in turn serves as a reference voltage to the capacitance $C_{3a}$ 722 during the second clock phase clk2. The net consequence of these actions is that after one clock period delay, In_p is added to an inverted version of In_n, while at the same time it is level shifted by either +Vref, 0, −Vref. This is accomplished without ever creating a transfer of charge between capacitors.

In a double-sampled embodiment, $C_{2a}$ 736 and $C_{4a}$ 738 perform similar functions to those described in connection with $C_{1a}$ 704 and $C_{3a}$ 722, but with opposite phased clock signals. More particularly, In_p 702 of the differential input signal is sampled onto capacitance $C_{2a}$ 736 with respect to ground on clock phase clk2 by closing switches 740 and 742. During clock phase clk2 of the illustrated embodiment, In_n 720 of the differential input signal is also sampled onto capacitance $C_{4a}$ 738 due to switches 744 and 746 being closed during clock phase clk2. In one embodiment of the invention, bottom plate sampling is used, where the input signals In_p 702 and In_n 720 are sampled on to the bottom plate of the capacitances $C_{2a}$ 736 and $C_{4a}$ 738 respectively. The top plates of capacitances $C_{2a}$ 736 and $C_{4a}$ 738 are coupled to ground during the clk2 phase.

On the next clock phase, clk1, $C_{2a}$ 736 is connected across the amplifier 724 due to switches 748 and 750 closing, and switches 740 and 742 opening. Thus, the top plate of capacitance $C_{2a}$ 736 is coupled to the negative input 730 of the amplifier 724, and the bottom plate of capacitance $C_{2a}$ 736 is coupled to the output (Out_p 732) of the amplifier 724. Assertion of clock phase ckl1 also causes capacitance $C_{4a}$ 738 to have its bottom plate connected to any one of the voltages +Vref, 0, −Vref, in response to the appropriate control output from the sub-DAC. Such sub-DAC control signals are labeled as the top (top_a), middle (mid_a), or bottom (bot_a). The top plate of capacitance $C_{4a}$ 738 is then coupled to the positive input terminal 734 of the amplifier 724. In this manner, one of the output control signals of the sub-DAC (i.e., bot_a, mid_a, top_a) selects the corresponding voltage +Vref, 0, or −Vref, which in turn serves as a reference voltage to the capacitance $C_{4a}$ 738 during the first clock phase ckl1.

Using the additional circuitry in such a double-sampled embodiment, the inputs In_p 702 and In_n 720 can be processed at double the rate of a single-sampling implementation, thereby doubling the conversion speed of the ADC using such circuit stages.

FIG. 7B illustrates a representative 1.5-bit ADC stage 760 corresponding to the second half of the differential implementation described in connection with FIG. 7A. The circuit stage 760 operates in an analogous manner as that described in connection with FIG. 7A, using another set of capacitances $C_{1b}$ 762 and $C_{3b}$ 764, as well as capacitances $C_{2b}$ 766 and $C_{4b}$ 768 for the double-sampling implementation. Further, because the circuit 760 forms a second half of a differential implementation, the input signals In_p 702 and In_n 720 are reversed such that the input signal In_n 720 is ultimately coupled to the negative input 730 of the amplifier 724, and the input signal In_p 702 is ultimately coupled to the positive input 734 of the amplifier 724. The amplifier 724 outputs the other differential signal, shown as output signal Out_n 770 in FIG. 7B. Otherwise, the operation is analogous to that described in connection with FIG. 7A, ultimately producing differential output signals Out_p 732 and Out_n 770.

Figure 8:
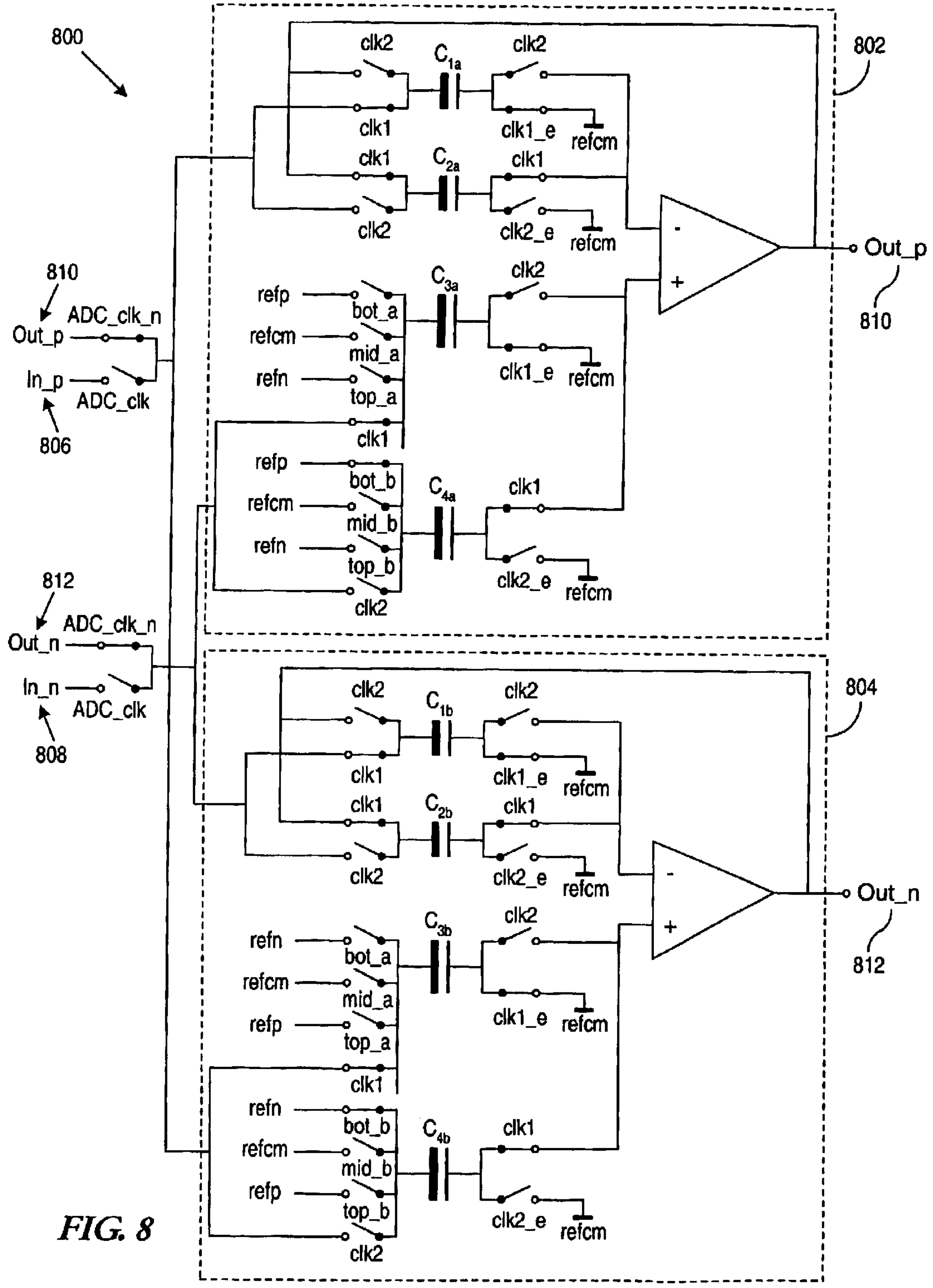
FIG. 8 illustrates an implementation of a differential ADC stage in accordance with the principles of the present invention.

FIG. 8 illustrates an implementation of the differential ADC stage 800 described in connection with FIGS. 7A and 7B. The illustrated embodiment represents an implementation of the differential ADC stage in the context of an algorithmic ADC. In this embodiment, circuit stages 802 and 804 correspond respectively to the circuits 700 and 760 described in connection with FIGS. 7A and 7B. In this embodiment, all voltage levels are shifted by a common mode voltage, refcm, such that the signal range is between refn and refp. Therefore, a single supply voltage may be used (i.e., 0 to Vdd). The illustrated ADC stage 800 is applied in an algorithmic ADC as previously described in connection with FIG. 2, with non-overlapping clocks ADC_clk and ADC_clk_n such that ADC_clk is high for one clock period and ADC_clk_n is high for the remaining N−2 clock periods as explained in connection with FIG. 2. The differential analog input signal (i.e., In_p 806; In_n 808) is sampled at the start of each conversion, using ADC_clk, while the gating with ADC_clk_n ensures that the differential output signal (i.e., Out_p 810; Out_n 812) is sampled for the remaining N−2 clock periods. A final instantaneous decision can be made with a 1-bit flash to determine the last bit, giving a total of N−1 clock cycles to resolve N bits.

Matching of the absolute values of reference voltages −Vref/4 and +Vref/4, and consequently refp-refcm and refcm-refn, is not needed in differential algorithmic/pipelined ADCS. Furthermore, refcm may be nominally set halfway between refp and refn, but its exact position is not critical.

Figure 9:
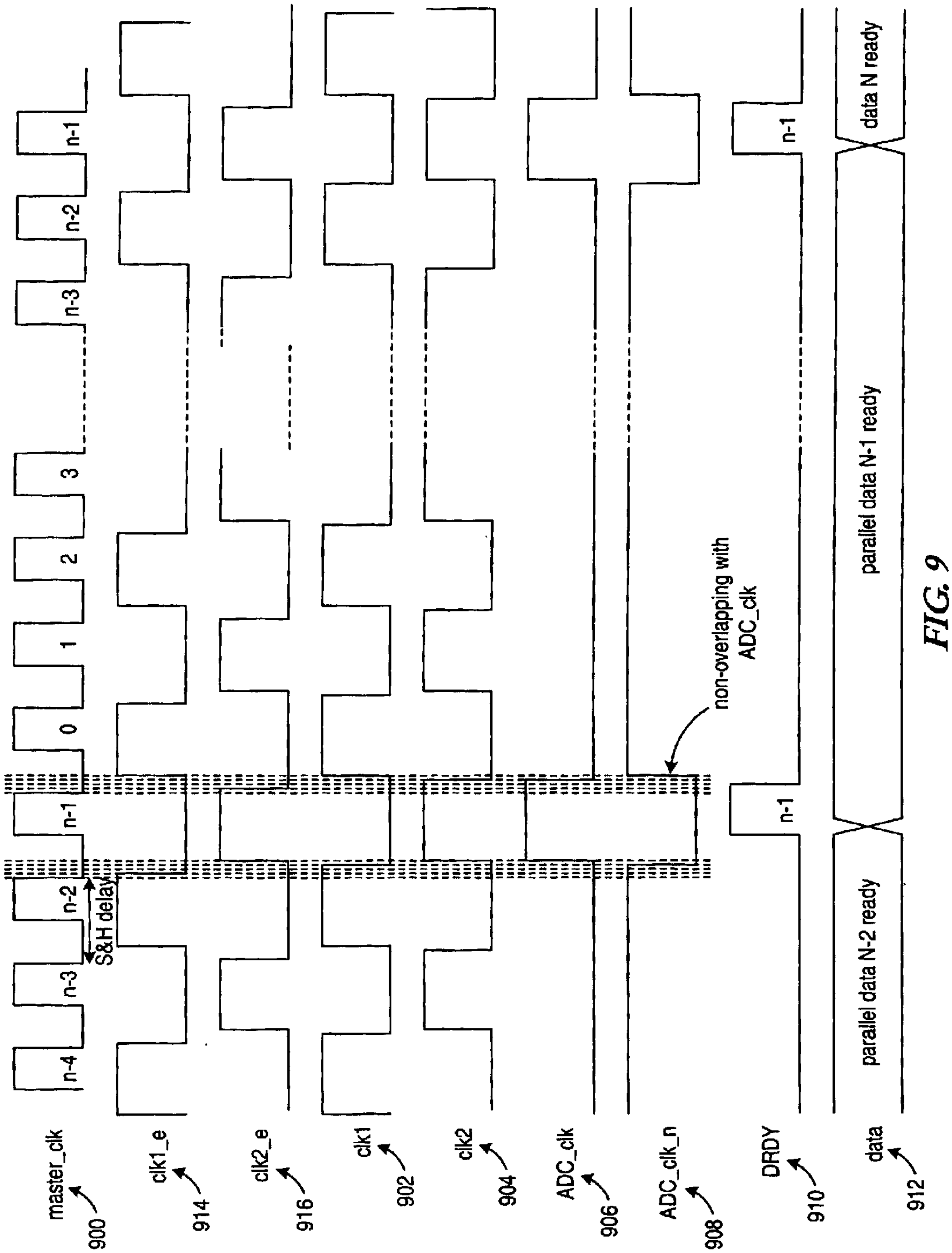
FIG. 9 illustrates a representative waveform diagram corresponding to an algorithmic ADC in accordance with the present invention.

FIG. 9 illustrates a representative waveform diagram corresponding to an algorithmic ADC such as described in connection with FIG. 8. A master clock 900 is provided, where ckl1 and clk2 are non-overlapping phases of the clock. For this algorithmic ADC, clocks ADC_clk 906 and ADC_clk_n 908 are non-overlapping, such that ADC_clk 906 is high for one clock period and ADC_clk_n 908 is high for the remaining N−2 clock periods. The data ready signal (DRDY) 914 is asserted when the ADC_clk 906 is asserted, thereby allowing the parallel data 912 to begin accumulating the associated digital data.

Non-overlapping clocks with early turn-off times, i.e., ckl1_e 914 and clk2_e 916, may be applied in the implementation of the algorithmic ADC. When the capacitors are sampling the input signals or references, the input switches switching with respect to refcm switch off early in one embodiment of the invention. On the other hand, switches connecting the capacitors to the inputs of the amplifiers should switch off late in accordance with this embodiment of the invention. In this manner, when in cyclic mode, the outputs of the amplifiers can be sampled by the oppositely-phased capacitor networks before any switching occurs around the amplifiers, ensuring clean sampling.

Figure 10A:
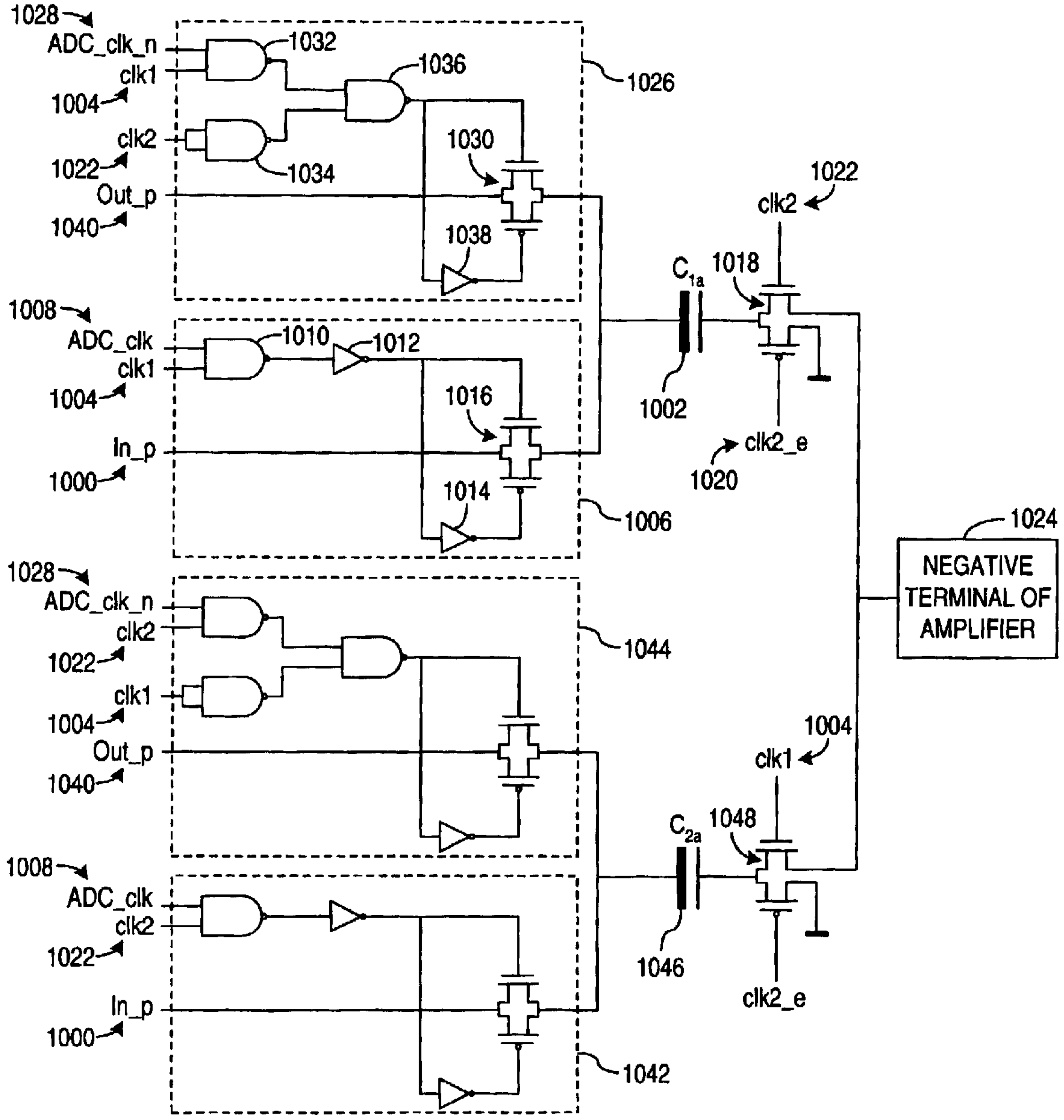
FIGS. 10A and 10B illustrate representative examples of an ADC stage corresponding to a first half of a differential, algorithmic ADC implementation in accordance with the present invention.
Figure 10B:
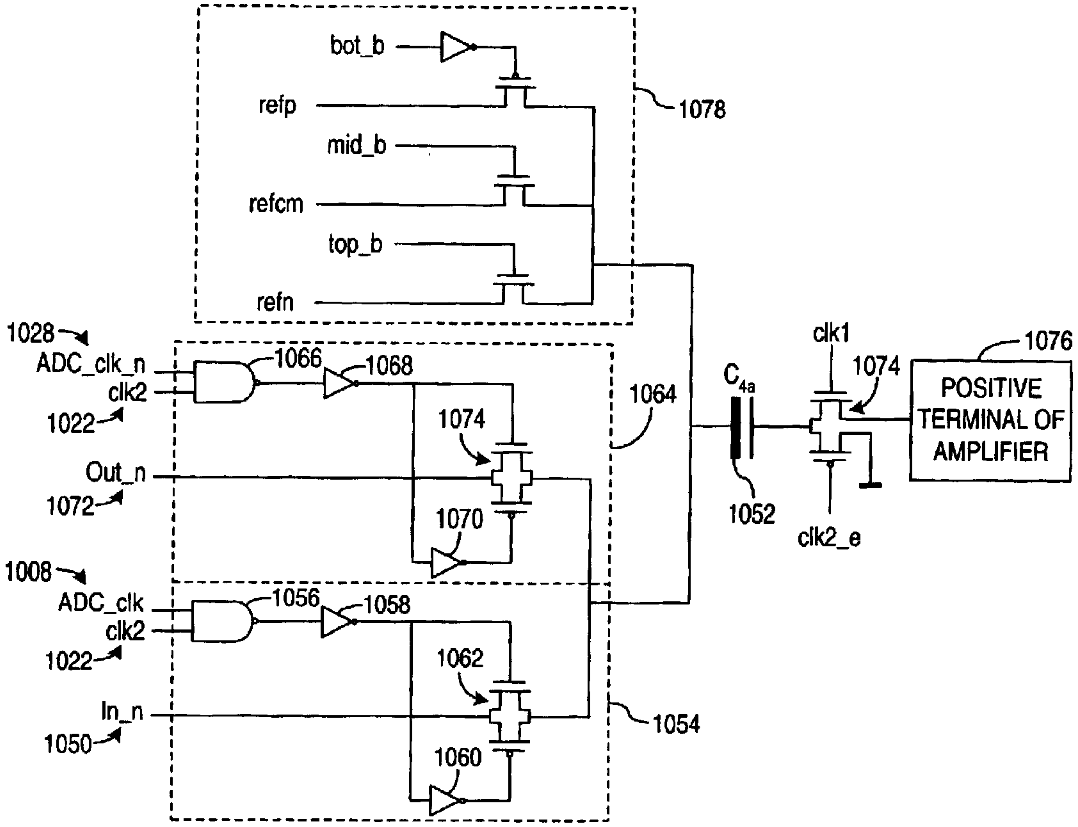

An example of an ADC stage corresponding to a first half of a differential, algorithmic ADC implementation, such as that described in connection with FIG. 8, is illustrated in FIGS. 10A and 10B. The example of FIGS. 10A and 10B is provided as a representative implementation, and those skilled in the art will appreciate that many variations to such an implementation are possible.

FIG. 10A corresponds to the circuitry coupled to the negative input of an amplifier, such as the switches and capacitors coupled to the negative input of the amplifier shown in block 802 of FIG. 8. As was described in connection with FIGS. 8 and 9, two opposite phased clock signals are used, namely clock phases ckl1 and clk2. The signal In_p 1000 of the differential input signal is sampled onto capacitance $C_{1a}$ 1002 with respect to a reference voltage such as refcm, on clock phase ckl1 1004. The signal 1000 is sampled onto $C_{1a}$ 1002 via switch circuit 1006. The ADC_clk 1008 enables the ckl1 1004 to be passed for one clock period, via the NAND gate 1010 and associated inverters 1012, 1014 to the CMOS switch 1016. Thus, when the ADC_clk 1008 and ckl1 1004 are asserted, the switch 1016 samples the In_p 1000 signal onto $C_{1a}$ 1002 with respect to the reference voltage through CMOS switch 1018 when switched by the early turn-off clock ckl1_e 1020.

On the next clock phase, clk2 1022, $C_{1a}$ 1002 is coupled to the negative terminal 1024 of the amplifier via switch circuit 1026. As previously indicated, the ADC_clk_n 1028 is high for the remaining N−2 clock periods, thereby gating the appropriate clock phase to the CMOS switch 1030 via the logic components 1032, 1034, 1036, 1038. The output signal Out_p 1040, from the output of the amplifier (not shown), is thus fed back to switch 1030 and coupled to the bottom plate of the capacitor $C_{1a}$ on clk2 1022.

In a double-sampled embodiment, switch circuits 1042 and 1044 are also provided. These switch circuits 1042, 1044 operate analogously to switch circuits 1006 and 1026 respectively, with the ckl1 1004 and clk2 1022 signals reversed with respect to switch circuits 1006 and 1026. In the double-sampled embodiment, In_p 1000 is sampled onto capacitance $C_{2a}$ 1046, and on the next clock phase $C_{2a}$ 1046 is coupled to the negative terminal 1024 of the amplifier via switch circuit 1048.

FIG. 10B corresponds to a portion of the circuitry coupled to the positive input of an amplifier, such as the switches and capacitors coupled to the positive input of the amplifier shown in block 802 of FIG. 8. Because the circuits associated with each of the capacitors $C_{3a}$ and $C_{4a}$ in a double-sampling implementation of FIG. 8 are analogous, only the circuitry of one such circuit is described in FIG. 10B.

In_n 1050 is sampled onto capacitance $C_{4a}$ 1052 via switch circuit 1054. This occurs when clk2 1056 is high, and ADC_clk 1008 is asserted on the first clock period of the algorithmic implementation. NAND gate 1056 and inverters 1058, 1060 enable passage of the In_n 1050 signal through the CMOS switch 1062 to be sampled on to $C_{4a}$ 1052. On all remaining stages, ADC_clk_n 1028 gates the clk2 1022 signal via switch circuit 1064, which includes NAND gate 1066 and inverters 1068, 1070, such that passage of the Out_n 1072 signal from the differential counterpart circuit is enabled through switch 1074 to be sampled on to $C_{4a}$ 1052, and ultimately switched via switch 1074 to the positive terminal 1076 of the amplifier.

The sub-DAC provides control signals, such as bot_b, mid_b, and top_b, which selectively provide a corresponding voltage refp, refcm, or refn to the bottom plate of the capacitor $C_{4a}$ via the level-shifting circuit 1078. In this manner, one of the output control signals of the sub-DAC (i.e., bot_b, mid_b, top_b) allows a corresponding voltage to level shift the voltage at the positive terminal 1076 of the amplifier.

A counterpart circuit (not shown) corresponding to the other half of the differential circuit shown in FIGS. 10A and 10B operates analogously.

Amplifiers that may be used in connection with the present invention, such as amplifier 724 described in connection with FIGS. 7A and 7B, can retain a significant amount of residual charge when switching from one N-bit conversion to the next. This is due to the parasitic capacitance at the input to the amplifiers, where this parasitic capacitance includes the oxide input capacitance of the amplifier, wiring capacitance, switch diffusion capacitance, etc. This charge is transferred to the signal capacitors at the start of the next new conversion, giving rise to a substantial degradation in performance when any over-range occurs in the ADC (i.e., an input signal which has an amplitude larger than refp-refn).

In accordance with the present invention, a novel amplifier reset methodology is implemented to address this residual charge problem between conversions. In one embodiment, a number of reset switches are timed to remove the residual charge on the amplifier terminals, while performing the N-bit conversion in N clock cycles of the master clock. As previously indicated, by using a final flash stage it is possible to convert an analog signal into a digital signal using N−1 clock periods of the master clock. The final decision is instantaneous and becomes available with the final LSB+1 bit in the DEC. Thus, during the sampling-in period with ADC-clk (described in connection with FIGS. 8, 9, 10A, 10B), the amplifiers may be reset, since their output is no longer necessary for the DEC. In this manner, the N-bit conversion can be performed in only one additional clock cycle, thereby resulting in an N-bit conversion in N clock cycles of the master clock. If no such reset action were performed, and the input were to fall below 0V for example, then the input signal must reach a minimum level of the offset that has been transferred to the signal capacitors before the ADC starts to convert properly again. Therefore, the reset circuit used in connection with the present invention dramatically improves the performance of the algorithmic ADC.

Figure 11:
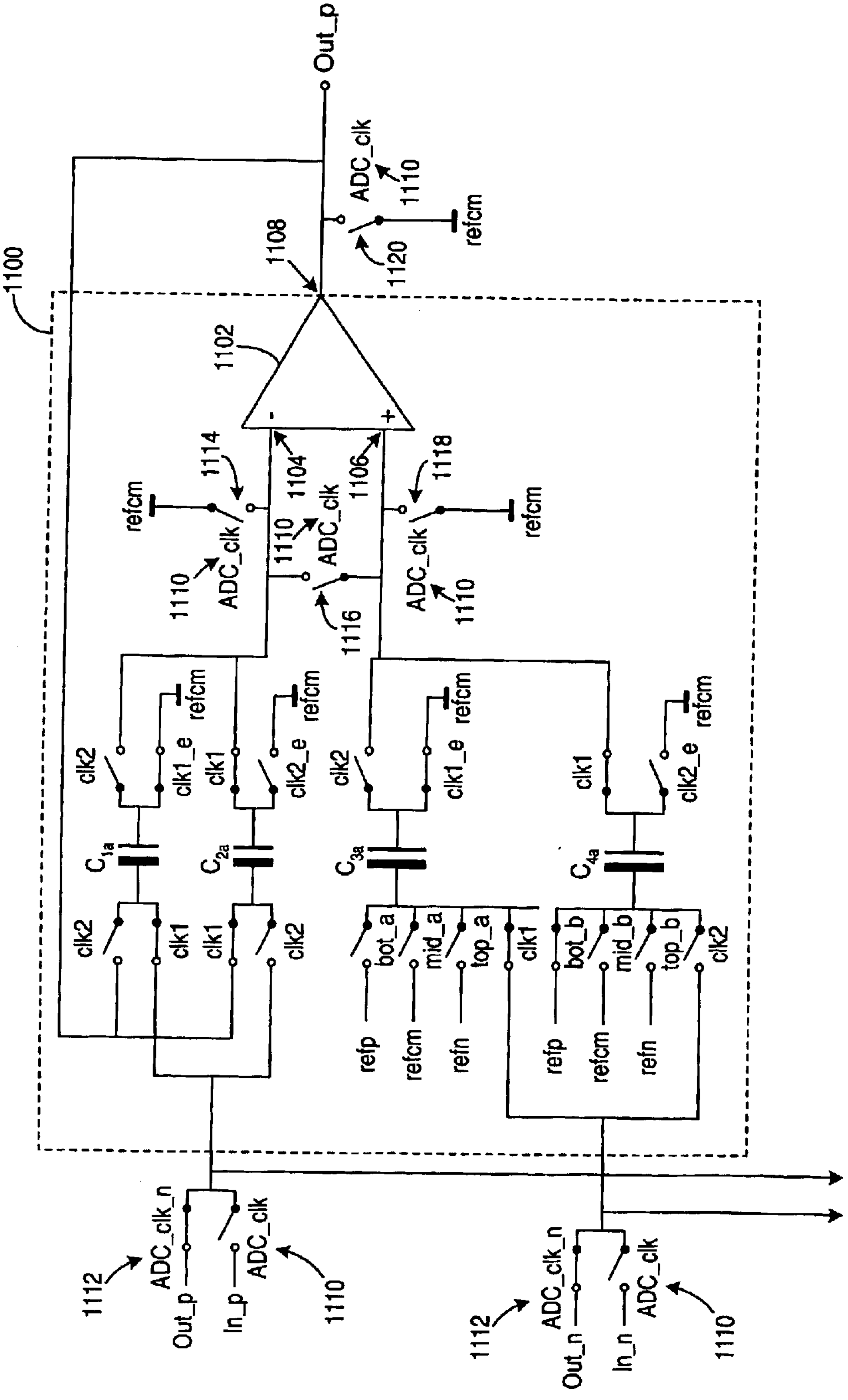
FIG. 11 illustrates a representative portion of an algorithmic ADC stage 1100 which implements such a reset circuit in accordance with one embodiment of the invention.

FIG. 11 illustrates a representative portion of an algorithmic ADC stage 1100 which implements such a reset circuit. The amplifier 1102, a single-ended amplifier in the illustrated embodiment, includes a negative input 1104, a positive input 1106, and an output 1108. AS indicated in connection with previously described embodiments, the derived clock signal ADC_clk 1110 may be used to trigger the initial sampling of the input signal in an algorithmic ADC, and the derived clock signal ADC_clk_n 1112 is used for the remaining N−2 clock periods. During the time that the new input signal is being sampled as enabled by ADC_clk 1110, the amplifier 1102 can be reset. It should be recognized that the amplifier 1102 can be reset using an additional clock cycle rather than during the sampling-in period corresponding to the ADC_clk 1110, however resetting the amplifier during this period allows the total conversion to be minimized.

Thus, when the ADC_clk 1110 is asserted, each of the switches 1114, 1116, 1118, and 1120 close, and discharge any charge to a reference voltage which is refcm in the illustrated embodiment. Reset switch 1114 is coupled between the negative input 1104 of the amplifier 1102 and refcm, and reset switch 1118 is coupled between the positive input 1106 of the amplifier 1102 and refcm. A reset switch 1116 is also coupled between the negative 1104 and positive 1106 inputs of the amplifier, which in turn are coupled to refcm. Finally, reset switch 1120 is coupled between the amplifier 1102 output 1108 and refcm. When the ADC_clk 1110 is asserted (e.g., transitions high), each of the switches 1114, 1116, 1118, 1120 are closed, thereby discharging parasitic capacitances to refcm.

Figure 12:
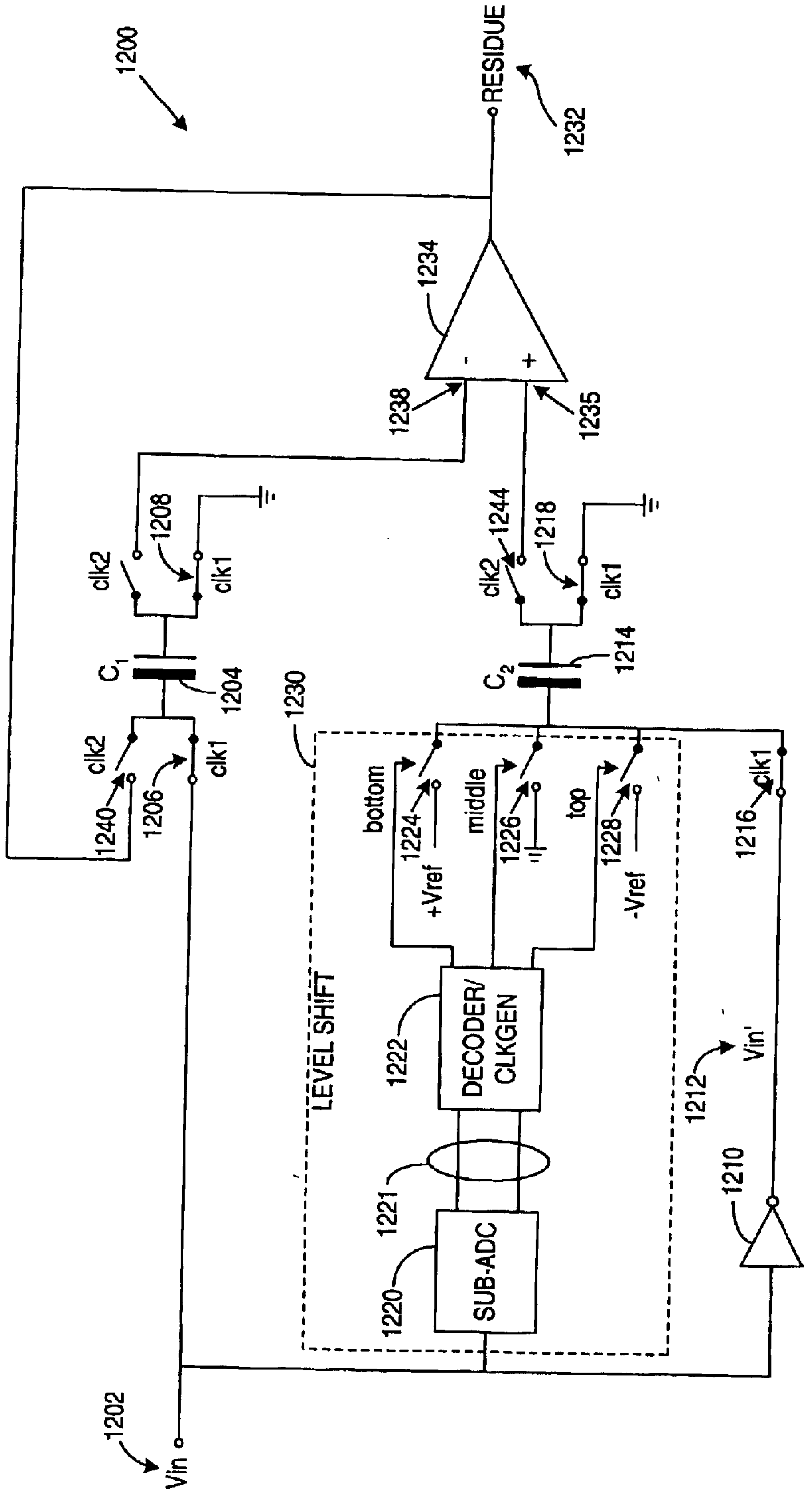
FIG. 12 illustrates a non-differential, single-sampling ADC stage in accordance with the principles of the present invention.

As indicated above, the ADC stage in accordance with the present invention may be used in a differential implementation. However, the principles of the present invention may also be implemented in a non-differential mode. FIG. 12 is an example of how the present invention may be implemented in a non-differential, single-sampling ADC stage 1200. In this example, the input signal, Vin 1202 is sampled onto a first capacitor $C_1$ 1204 when switches 1206, 1208 are closed during ckl1. A complemented version of the Vin 1202 signal is generated in any known manner, represented by the inverter 1210. Thus, this inverted signal, Vin' 1212 is sampled onto $C_2$ 1214 during ckl1 when switches 1216, 1218 are closed.

During the ckl1 phase, the Vin 1202 signal is also received at the sub-ADC circuit 1220 of a level shifting circuit 1230, where the sub-ACD circuit 1220 provides the 1.5-bit (or other) data 1221, the value of which depends on the Vin 1202 analog voltage level. This 1.5-bit digital output is received by the decoder/clock generator (clkgen) circuit 1222. On the next clock phase clk2, the decoder/clkgen 1222 asserts one of a plurality of control signals based on the 1.5-bit data 1221, such as the "bottom," "middle," or "top" signals. The asserted one of the bottom, middle, or top signals closes a corresponding one of the switches 1224, 1226, 1228 of the level shift circuit 1230. Depending on which of the switches 1224, 1226, 1228 is closed, the corresponding reference voltage −Vref, 0, +Vref is used to shift the output signal RESIDUE 1232 of the amplifier 1234, by providing the selected reference voltage to the positive input 1235 of the amplifier 1234.

The RESIDUE 1232 signal 1232 is generated during the clk2 phase, where the sampled voltage on $C_1$ 1204 is coupled between the output 1236 and the negative terminal 1238 of the amplifier 1234, due to switches 1240 and 1242 closing and switches 1206 and 1208 opening. Further, the sampled voltage on $C_2$ 1214 is coupled to the positive input 1235 of the amplifier 1234 when switch 1244 closes in response to clk2.

The Vin 1202 signal is therefore inverted, and the complementary signals Vin 1202 and Vin' 1212 are sampled, and provided to the amplifier 1234 as the Vin 1202 signal and an inverted version of the complemented Vin signal, to provide the MX2 function by adding these signals. The RESIDUE 1232 is provided as a result of the subtraction of the voltage provided by the level shift circuit 1230 and the MX2 function performed at the amplifier 1234. As can be seen, the subtraction/level shifting, residue multiplication by two, and sample/hold functions are all performed in one clock cycle, independent of any capacitor mismatch that may occur between the signal capacitors $C_1$ 1204 and $C_2$ 1214.

It is noted that the sub-ADC 1220, decoder/clkgen 1222, and level shift circuit 1230 are representative of the circuit (or equivalent thereof) that may be used to provide the coarse analog-to-digital conversion, decoding, and level shift functions for any of the embodiments of the present invention described herein.

Figure 13:
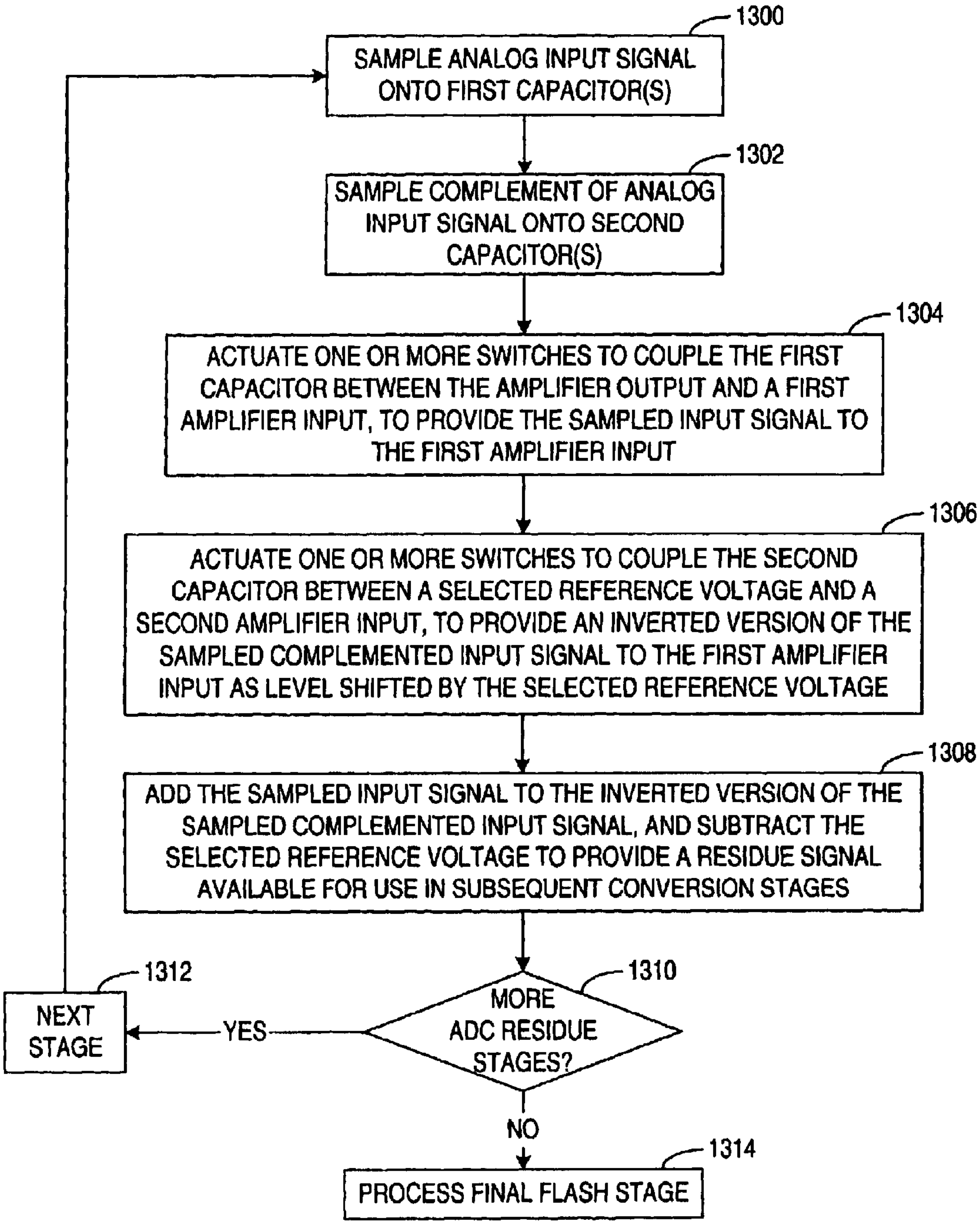
FIG. 13 is a flow diagram of a method for converting an analog input signal to a digital input signal in accordance with one embodiment of the present invention.

FIG. 13 is a flow diagram of a method for converting an analog input signal to a digital input signal in accordance with one embodiment of the present invention. The analog input signal is sampled 1300 onto a first capacitor, or group of capacitors or capacitive elements collectively providing a capacitance in which the input signal may be stored. A complemented analog input signal, i.e., an inversion of the analog input signal, is similarly sampled 1302 onto a second capacitor(s). One or more switches are actuated 1304 in order to couple the first capacitor between the amplifier output and a first amplifier input, in a unity gain feedback arrangement. The sampled input signal is thus provided to the first amplifier input, such as the inverting/negative amplifier input. One or more switches are also actuated 1306 in order to couple the second capacitor between a selected reference voltage and a second amplifier input, in order to provide an inverted version of the sampled complemented input signal to the first amplifier input as level-shifted by the selected reference voltage. The sampled input signal is added 1308 to the inverted version of the complemented input signal using the amplifier, and the selected reference voltage is effectively subtracted from the output in order to provide a residue signal available for use in subsequent conversion stages.

If there are more ADC residue stages in the ADC as determined at decision block 1310, then the next stage 1312 is considered, and the process is repeated for that stage. When there are no further stages, such as when N−1 stages have been processed in an algorithmic or pipelined ADC configuration, then the final flash stage can be processed 1314 as previously described.

Each of the illustrated embodiments (as well as other embodiments of the present invention not illustrated herein) not only provide a significantly more accurate conversion, the resulting ADC is substantially faster than prior art $ADC_s$ employing analogous hardware. In other words, the use of amplifiers and capacitors in both prior art systems and in the present invention, the present invention is substantially faster than the prior art systems by virtue of the fact that the feedback factor (and, consequently the gainbandwidth) for the amplifiers is substantially larger.

The foregoing description of various exemplary embodiments of the invention has been presented for the purposes of illustration and description. It is not intended to be exhaustive or to limit the invention to the precise from disclosed. Many modifications and variations are possible in light of the above teaching. It is intended that the scope of the invention be limited not with this detailed description, but rather by the claims appended hereto.

What is claimed is:

1. An analog-to-digital converter (ADC) stage for use in ADCs, comprising:

an amplifier having first and second input terminals, and an output terminal to provide an analog ADC residue signal;

first and second capacitances coupled to sample an input voltage signal and a complemented input voltage signal respectively in response to a first clock phase;

a level shifting circuit coupled to receive the input voltage signal, and to select one of a plurality of reference voltages in response to a second clock signal;

a first switch circuit coupled to the first capacitance to provide the sampled input voltage signal to the first input terminal of the amplifier, and to couple the output terminal of the amplifier to the first capacitance via a feedback loop, in response to the second clock phase;

a second switch circuit coupled to the second capacitance to provide an inverted version of the sampled complemented input voltage signal to the second input terminal of the amplifier and to reference the second capacitance to the selected reference voltage in response to the second clock phase;

wherein the amplifier adds the input signal to the inverted version of the complemented input signal as shifted by the selected reference voltage to create the analog ADC residue signal for use in a subsequent ADC stage.

2. The ADC stage as in claim 1, wherein the level shifting circuit comprises:

a sub-ADC coupled to receive the input voltage signal, and to provide a digital code based on a voltage of the input voltage signal;

a decoder circuit coupled to the sub-ADC to receive the digital code and to assert one of a plurality of switch signals in response thereto; and a plurality of switches, each coupled to a different one of the plurality of reference voltages; and wherein the asserted one of the switch signals closes a corresponding one of the plurality of switches to couple a corresponding one of the plurality of reference voltages to the second capacitance to add to the inverted version of the sampled complemented input voltage.

3. The ADC stage as in claim 2, wherein the digital code is an n-bit binary code having $2^n$ possible values, and wherein each of the $2^n$ possible values enables a different one of the plurality of switch signals to be asserted by the decoder circuit.

4. The ADC stage as in claim 2, wherein the digital code is a 1.5-bit binary code having three possible values, and wherein each of the three possible values enables a different one of the plurality of switch signals to be asserted by the decoder circuit.

5. The ADC stage as in claim 1, wherein:

the first capacitance comprises at least one capacitor having a top plate and a bottom plate;

the top plate of the capacitor is coupled to a first reference voltage via the first switch circuit during the first clock phase, and to the first input terminal of the amplifier via the first switch circuit during the second clock phase; and the bottom plate of the capacitor is coupled to the input voltage signal through the first switch circuit during the first clock phase, and to the output terminal of the amplifier via the first switch circuit during the second clock phase.

6. The ADC stage as in claim 1, wherein:

the second capacitance comprises at least one capacitor having a top plate and a bottom plate;

the top plate of the capacitor is coupled to a second reference voltage via the second switch circuit during the first clock phase, and to the second input terminal of the amplifier via the second switch circuit during the second clock phase; and the bottom plate of the capacitor is coupled to the complemented input voltage signal through the second switch circuit during the first clock phase, and to the reference voltage selected by the level shifting circuit via the second switch circuit during the second clock phase.

7. The ADC stage as in claim 1, further comprising a reset circuit coupled to the amplifier to discharge residual charge present at one or more of the first and second input terminals and output terminal of the amplifier to clear a current analog ADC residue signal in preparation for output of a subsequent analog ADC residue signal.

8. The ADC stage as in claim 7, wherein the reset circuit comprises a plurality of switches each coupled between a reference voltage and a different one of the first input terminal, second input terminal, and output terminal.

9. The ADC stage as in claim 8, wherein the reset circuit further comprises a switch coupled between the first and second input terminals.

10. The ADC stage as in claim 9, wherein each of the switches is closed in response to the first clock phase to enable the residual charge to be discharged to the reference voltage.

11. The ADC stage as in claim 1, wherein the first and second capacitance comprise first and second capacitor components that are substantially electrically isolated from each other via an impedance between the first and second input terminals of the amplifier.

12. The ADC stage as in claim 1, further comprising an inverter coupled to receive the input voltage signal and to generate the complemented input voltage signal.

13. The ADC stage as in claim 1, wherein the input voltage signal and complemented input voltage signal comprise complementary input voltage signals of a differential input voltage signal.

14. The ADC stage as in claim 1, wherein the amplifier is a single-ended operational amplifier.

15. The ADC stage as in claim 1, further comprising:

third and fourth capacitances coupled to sample the input voltage signal and the complemented input voltage signal respectively in response to the second clock phase;

a second level shifting circuit coupled to receive the input voltage signal, and to select one of a plurality of second reference voltages in response to the first clock phase;

a third switch circuit coupled to the third capacitance to provide the sampled input voltage signal to the first input terminal of the amplifier, and to couple the output terminal of the amplifier to the third capacitance via a second feedback loop, in response to the first clock phase;

a fourth switch circuit coupled to the fourth capacitance to provide an inverted version of the sampled complemented input voltage signal to the second input terminal of the amplifier and to reference the fourth capacitance to the selected second reference voltage in response to the first clock phase;

wherein the amplifier adds the input signal to the inverted version of the complemented input signal as shifted by the selected second reference voltage to create a second analog ADC residue signal for use in a subsequent ADC stage.

16. A method for converting an analog input signal to a digital signal using an amplifier, the method comprising:

(a) sampling the analog input signal onto a first capacitor and a complement of the analog input signal onto a second capacitor;

(b) providing the sampled analog input signal at a first input terminal of the amplifier by controllably coupling the first capacitor between the amplifier output and the first input terminal in a unity gain feedback configuration;

(c) providing the sampled complemented analog input signal, level shifted by one of a plurality of selectable reference voltages, at a second input terminal of the amplifier by controllably coupling the second capacitor between a selected one of the reference voltages and the second input terminal of the amplifier; and (d) adding the sampled analog input signal to an inverted version of the sampled complemented analog input signal and subtracting the selected one of the reference voltages to provide a residue signal available for use in subsequent conversion stages.

17. The method of claim 16, further comprising repeating steps (a)–(d) for each of the first M−1 stages of an M-stage analog-to-digital conversion having an N-bit resolution.

18. The method of claim 17, further comprising resolving least significant bits of the digital signal in an M-th flash stage of the analog to digital conversion, by comparing the residue signal from the M−1 stage to a set of predetermined reference voltages.

19. The method of claim 18, wherein the set of predetermined reference voltages comprises $2^n=1$ reference voltages, wherein n corresponds to a resolution of the M-th stage.

20. The method of claim 19, further comprising resolving N−M bits at the M-th stage of the analog-to-digital conversion having the N-bit resolution.

21. The method of claim 16, wherein the analog input signal and the complemented analog input signal comprise two signals of a differential signal pair.

22. The method of claim 16, further comprising inverting the analog input signal create the complemented analog input signal.

23. The method of claim 16, further comprising providing a multi-phase clock signal including a first clock phase and a second clock phase, and wherein step (a) is performed during the first clock phase and steps (b), (c), and (d) are performed during the second clock phase.

24. The method of claim 23, wherein controllably coupling the first capacitor between the amplifier output and the first input terminal comprises activating one or more switches coupled between the amplifier output and the first input terminal to complete a circuit path therebetween in response to a transition of the second clock phase.

25. The method of claim 24, further comprising activating one or more sampling switches coupled between the analog input signal and a reference voltage in response to a first transition of the first clock phase, and deactivating the sampling switches in response to a second transition of the first clock phase.

26. The method of claim 23, wherein controllably coupling the second capacitor between a selected one of the reference voltages and the second input terminal of the amplifier comprises activating one or more switches coupled between the selected one of the reference voltages and the second input terminal of the amplifier to complete a circuit path therebetween in response to a transition of the second clock phase.

27. The method of claim 26, further comprising activating one or more sampling switches coupled between the selected one of the reference voltages and the second input terminal of the amplifier in response to a first transition of the first clock phase, and deactivating the sampling switches in response to a second transition of the first clock phase.

28. An analog-to-digital converter (ADC) stage for use in converting a differential analog input signal to a digital signal, comprising:

a first single-ended amplifier arranged in a unity feedback configuration;

first and second sampling means for sampling the differential analog input signal at a first time;

first switch means coupled to the first and second sampling means and to the first amplifier for providing the sampled differential analog input signal to first and second input terminals of the first amplifier, and to provide a level-shift voltage to offset the sampled differential analog input signal at the second input terminal of the first amplifier, at a second time;

a second single-ended amplifier arranged in a unity feedback configuration;

third and fourth sampling means for sampling the differential analog input signal at the first time;

second switch means coupled to the third and fourth sampling means and to the second amplifier for providing the sampled differential analog input signal to first and second input terminals of the second amplifier, and to provide a level-shift voltage to offset the sampled differential analog input signal at the second input terminal of the second amplifier; and wherein the first and second amplifiers respectively add the respective sampled differential analog input signals and subtract the level-shift voltage, and collectively output a differential output signal at the second time.

29. An analog-to-digital converter (ADC) stage for use in differential ADCs, comprising:

(a) a first sample and hold circuit, comprising:

(1) a first single-ended amplifier having first and second input terminals, and an output terminal to output a first half of a differential residue signal;

(2) a first sampling circuit comprising first and second capacitors to respectively store first and second voltages of a differential input signal at a first time;

(3) a first switch circuit coupled to the first amplifier and to the first sampling circuit to switch the first capacitor between the first amplifier's output terminal and its first input terminal, and to switch the second capacitor between a selectable level-shift voltage and the first amplifier's second input terminal;

(4) wherein the first amplifier adds the first and second voltages, subtracts a selected one of the selectable level-shift voltages, and outputs the first half of the differential residue signal at a second time;

(b) a second sample and hold circuit, comprising:

(1) a second single-ended amplifier having first and second input terminals, and an output terminal to output a second half of the differential residue signal;

(2) a second sampling circuit comprising third and fourth capacitors to respectively store the second and first voltages of the differential input signal at the first time;

(3) a second switch circuit coupled to the second amplifier and to the second sampling circuit to switch the third capacitor between the second amplifier's output terminal and its first input terminal, and to switch the fourth capacitor between the selectable level-shift voltage and the second amplifier's second input terminal; and (4) wherein the second amplifier adds the second and first voltages, subtracts a selected one of the selectable level-shift voltages, and outputs the second half of the differential residue signal at the second time.

30. An algorithmic analog-to-digital converter (ADC) to convert an input voltage signal to a digital data signal, comprising:

(a) an ADC stage to receive the input voltage signal and to create an analog ADC residue signal, the ADC stage comprising:

(1) an amplifier having first and second input terminals, and an output terminal;

(2) first and second capacitances coupled to sample the input voltage signal and a complemented input voltage signal respectively in response to a first clock phase;

(3) a first switch circuit coupled to the first capacitance to provide the sampled input voltage signal to the first input terminal of the amplifier, and to couple the output terminal of the amplifier to the first capacitance via a feedback loop, in response to a second clock phase;

(4) a second switch circuit coupled to the second capacitance to provide an inverted version of the sampled complemented input voltage signal to the second input terminal of the amplifier in response to the second clock phase;

(5) a sub-ADC circuit coupled to receive the input voltage signal, and in response, to provide a digital data subset of the digital data signal;

(6) a decoder coupled to the sub-ADC circuit to receive the digital data subset and to select one of a plurality of reference voltages to add to the inverted version of the complemented input voltage in response thereto;

(7) wherein the amplifier outputs the analog ADC residue signal by adding the sampled input voltage signal to the inverted version of the sampled complemented input voltage as shifted by the level shifting circuit; and (b) a feedback loop to provide the analog ADC residue signal as the input voltage signal to the ADC stage for N−1 additional cycles of an N-cycle analog-to-digital conversion.

31. The algorithmic ADC as in claim 30, further comprising a final flash stage coupled to the ADC stage to receive the analog ADC residue signal from the ADC stage corresponding to the N−1 cycle of the N-cycle analog-to-digital conversion, and to provide a least significant digital data subset of the digital data signal.

32. The algorithmic ADC as in claim 31, further comprising an accumulation circuit to accumulate each of the digital data subsets to create the digital data signal.

33. The algorithmic ADC as in claim 32, wherein the accumulation circuit comprises a digital error correction (DEC) circuit to add together each of the digital data subsets and to concatenate the least significant digital data subset to create the digital data signal.

34. A pipelined analog-to-digital converter (ADC) to convert an input voltage signal to a digital data signal, comprising:

(a) a plurality of N−1 pipelined ADC stages, wherein a first pipelined ADC stage receives the input voltage signal, and the remaining N−1 pipelined ADC stages receive an analog ADC residue signal from a prior ADC stage as its input voltage signal, each of the plurality of ADC stages comprising:

(1) an amplifier having first and second input terminals, and an output terminal;

(2) first and second capacitances coupled to sample the input voltage signal and a complemented input voltage signal respectively in response to a first clock phase;

(3) a first switch circuit coupled to the first capacitance to provide the sampled input voltage signal to the first input terminal of the amplifier, and to couple the output terminal of the amplifier to the first capacitance via a feedback loop, in response to a second clock phase;

(4) a second switch circuit coupled to the second capacitance to provide an inverted version of the sampled complemented input voltage signal to the second input terminal of the amplifier in response to the second clock phase;

(5) a sub-ADC circuit coupled to receive the input voltage signal, and in response, to provide a digital data subset of the digital data signal;

(6) a decoder coupled to the sub-ADC circuit to receive the digital data subset and to select one of a plurality of reference voltages to add to the inverted version of the complemented input voltage in response thereto;

(7) wherein the amplifier outputs the analog ADC residue signal by adding the sampled input voltage signal to the inverted version of the sampled complemented input voltage as shifted by the level shifting circuit; and (b) an Nth pipelined ADC stage coupled to the N−1 ADC stage to resolve least significant bits of the digital data signal.

* * * * *